United States Patent [19]
Horiguchi et al.

[11] Patent Number: 5,289,425
[45] Date of Patent: Feb. 22, 1994

[54] SEMICONDUCTOR INTEGRATED CIRCUIT DEVICE

[75] Inventors: Masashi Horiguchi, Kawasaki; Kiyoo Itoh, Higashikurume; Yoshiki Kawajiri, Akishima; Goro Kitsukawa, Tokyo; Takayuki Kawahara; Takesada Akiba, both of Kokubunji, all of Japan

[73] Assignee: Hitachi, Ltd., Tokyo, Japan

[21] Appl. No.: 870,460

[22] Filed: Apr. 17, 1992

[30] Foreign Application Priority Data

Apr. 18, 1991 [JP] Japan .................................. 3-086549
Sep. 3, 1991 [JP] Japan .................................. 3-222698

[51] Int. Cl.⁵ .............................................. G11C 8/00
[52] U.S. Cl. ............................ 365/226; 365/189.09; 307/296.6
[58] Field of Search ........... 365/226, 227, 229, 189.09; 307/296.6, 43, 52, 60, 296.1; 323/269, 270, 303

[56] References Cited

U.S. PATENT DOCUMENTS 4,748,340  5/1988  Schmidt ............................ 307/60
4,916,389  4/1990  Hori et al. ...................... 307/296.1
5,046,052  9/1991  Miyaji et al. ..................... 265/226
5,153,452 10/1992  Iwamura et al. ................... 365/226
5,173,875 12/1992  Uomatsu et al. ................... 365/226

FOREIGN PATENT DOCUMENTS 2-246516 10/1990 Japan .

OTHER PUBLICATIONS

IEEE Journal of Solid State Circuits, vol. 26, No. 4, Apr. 1991, pp. 465–471.

Primary Examiner—Eugene R. LaRoche
Assistant Examiner—Tan Nguyen
Attorney, Agent, or Firm—Antonelli, Terry, Stout & Kraus

[57] ABSTRACT

An intermediate voltage generating circuit for generating a voltage lying between an external power supply voltage and a ground voltage, and two voltage limiter circuits for generating internal power supply voltages and stabilized with this intermediate voltage as a reference are provided in a semiconductor integrated circuit. Even if the external power supply voltage or the ground voltage fluctuates, no disagreement is produced between a logical threshold of a circuit operating on the external power supply voltage and a logical threshold of a circuit operating on the internal power supply voltage.

4 Claims, 27 Drawing Sheets

EXTERNAL POWER SUPPLY VOLTAGE Vcc

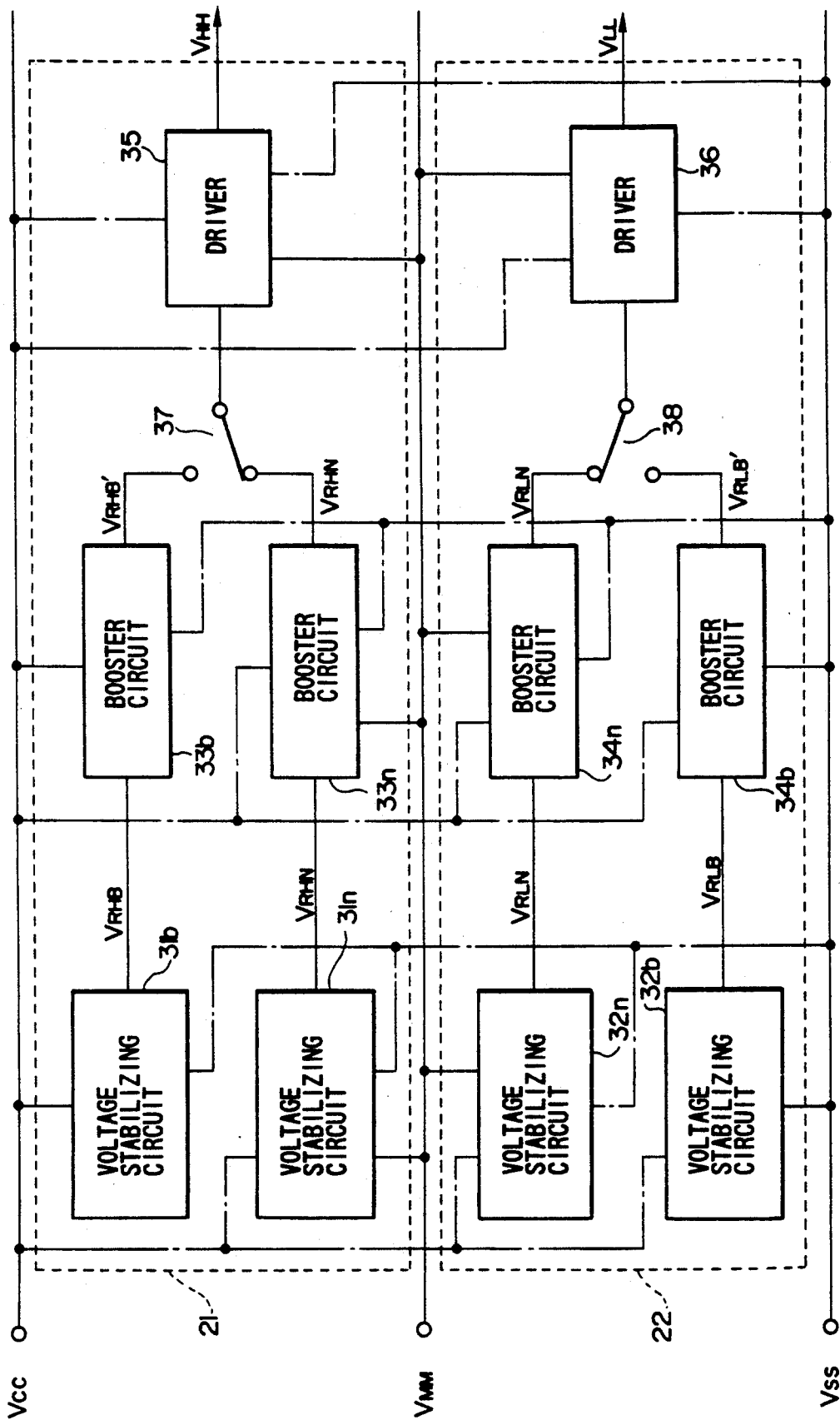

—— $V_{LT1}$
- - - - $V_{LT2}$

FIG. 40
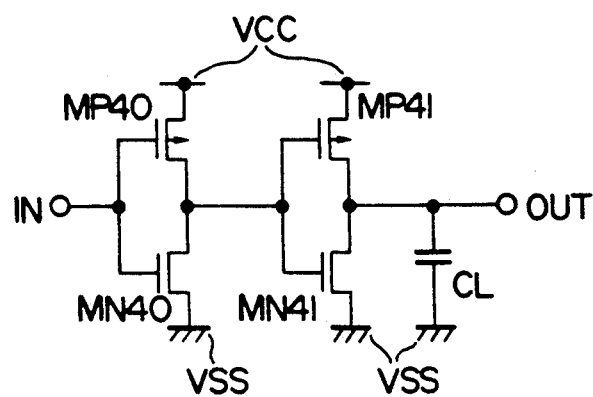
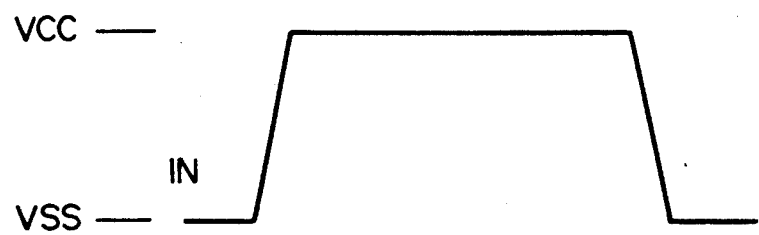
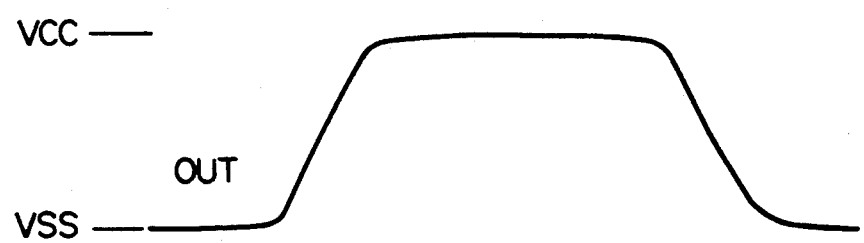

SEMICONDUCTOR INTEGRATED CIRCUIT DEVICE

BACKGROUND OF THE INVENTION

1. Field of the Invention

The present invention relates to a semiconductor integrated circuit device, and more particularly to a semiconductor integrated circuit device having a voltage converter circuit or a load drive circuit.

2. Description of the Prior Art

It is performed frequently in recent years that an internal voltage lower than an external power supply voltage is generated in a semiconductor integrated circuit device, and a partial circuit in the semiconductor integrated circuit device is operated with the internal voltage as a power supply. This is performed for the purpose of reducing power consumption of the integrated circuit and also of coping with lowering of breakdown voltage with the scaling-down of elements.

A circuit for generating an internal power supply voltage from an external power supply voltage as described above is a voltage limiter circuit (a voltage converter circuit or a step-down circuit).

FIG. 21 shows an example of a conventional semiconductor integrated circuit device having a voltage limiter circuit. A reference numeral 1 represents a semiconductor chip, 2 represents a terminal for an external power supply voltage (VCC), 3 represents a terminal for a ground voltage (VSS), 90 represents a voltage limiter circuit for generating an internal power supply voltage (VL), 91 represents a circuit operating on the internal power supply voltage (VL), and 92 represents a circuit operating on the external power supply voltage (VCC).

FIG. 23 shows another example of a conventional semiconductor integrated circuit device having voltage limiter circuits. This is disclosed in JP-A-2-246516, and is characterized by having two sets of voltage limiter circuits. Namely, voltage limiter circuits 93 and 94 generate internal power supply voltages VHH and VLL, respectively. 95 represents a circuit operating on VHH and VLL as the power supply thereof, and 96 represents a circuit operating on VCC and VSS as the power supply.

On the other hand, a CMOS inverter circuit shown in FIG. 40 has been heretofore used for driving a load in a semiconductor integrated circuit device.

SUMMARY OF THE INVENTION

In the above-mentioned conventional voltage limiter, following problems are posed with lowering of the operating voltage.

A first problem is deterioration of resistance against fluctuation of the external power supply voltage. In general, when a logical amplitude of a circuit becomes smaller, a noise margin becomes smaller following it. Hence, the noise has to be suppressed to the utmost. In the above-mentioned prior art, however, such a phenomenon that, when the external power supply voltage fluctuates, an equivalent noise is generated presents itself. This is explained with reference to the drawings.

FIG. 22 shows operating waveforms in case the external power supply voltage fluctuates in the conventional example shown in FIG. 21. In FIG. 22, a shows a case when VCC fluctuates and b shows a case when VSS fluctuates, and fluctuations of the output VL of the voltage limiter and logical thresholds VLT1 and VLT2 of the circuits 91 and 92 in respective cases are shown. When a signal is transferred between the circuit 91 and the circuit 92, it is desirable that logical thresholds of both circuits are in accord with each other. Here, description will be made of a case that the logical threshold when the power supply does not fluctuate is set at $VLT1=VLT2=(VL+VSS)/2$, but the same is also applied to a case where the logical threshold is set at another value. Here, when VCC or VSS fluctuates, the logical threshold varies as described hereunder.

First, a case where VCC fluctuates by $\Delta V$ will be described.

Since the output VL of the voltage limiter 90 is stabilized with VSS as reference, VL does not vary even if VCC fluctuates. Hence, the logical threshold VLT1 of the circuit 91 varies neither.

On the other hand, the logical threshold VLT2 of the circuit 92 is at a point where the potential difference between VCC and VSS is divided at $(1-\alpha):\alpha$, it varies by $\alpha\Delta V$. Here, $\Delta=VLT2/VCC$.

Next, a case that VSS fluctuates by $\Delta V$ will be described.

In this case, VL varies by $\Delta V$, and the logical threshold VLT1 varies by $\Delta V$. On the other hand, the logical threshold VLT2 of the circuit 92 varies by $(1-\alpha)\Delta V$. Namely, in either case, disagreement of logical thresholds is produced in the circuit 91 and the circuit 92, and it is equivalent to that a noise for the portion of such disagreement is generated.

FIG. 24 and FIG. 25 show operating waveforms of the conventional example shown in FIG. 23 in case the external power supply voltage fluctuates.

FIG. 24 shows a case that both outputs VHH and VLL of the voltage limiters 93 and 94 are stabilized with VSS as reference, and FIG. 25 shows a case that these outputs are stabilized with VCC as reference. In these figures, a shows a case when VCC fluctuates and b shows a case when VSS fluctuates, and fluctuations of the outputs VHH and VLL of the voltage limiters and the logical thresholds VLT1 and VLT2 of the circuits 95 and 96 are shown. Here, a case of $VLT1=VLT2=(VHH+VLL)/2=(VCC+VSS)/2$ will be explained for the sake of simplicity. Namely, it is assumed that the logical threshold of the circuit 95 is set at the center between the internal power supply voltages VHH and VLL, and the logical threshold of the circuit 96 is set at the center between the external power supply voltages VCC and VSS, respectively.

First, a case where VCC fluctuates by $\Delta V$ will be described with reference to FIG. 24. Since VHH and VLL are stabilized with VSS as reference, both VHH and VLL do not vary even if VCC fluctuates. Hence, the logical threshold VLT1 of the circuit 95 varies neither. On the other hand, the logical threshold VLT2 of the circuit 96 varies by $\Delta V/2$ since VLT2 is at the center between VCC and VSS. Next, a case where VSS fluctuates by $\Delta V$ will be described. In this case, both VHH and VLL vary by $\Delta V$, and the logical threshold VLT1 also varies by $\Delta V$. On the other hand, the logical threshold VLT2 of the circuit 96 varies by $\Delta V/2$. Namely, in either case, disagreement of the logical threshold by $\Delta V/2$ is produced between the circuit 91 and the circuit 92, which is equivalent to that noise for the portion of disagreement is generated. A case shown in FIG. 24 has been described above, but the same is applied to a case where VHH and VLL are stabilized with VCC as reference as shown in FIG. 25. In this case, disagreement of logical thresholds by $\Delta V/2$ is produced by fluctuation of VCC or VSS.

A second problem caused by lowering of the operating voltage is lowering in the operation speed. According to a well-known scaling rule of a MOS, it is sufficient that the power supply voltage is lowered in proportion to reduction of dimensions of a MOSFET. Since tailing characteristics cannot be applied with scaling, however, it is not possible to lower the threshold voltage of the MOSFET in order to prevent a subthreshold current due to tailing. Accordingly, the transfer conductance of the MOSFET is lowered with lowering of the power supply voltage, and the operation speed is reduced.

The operation speed of a CMOS inverter circuit as a conventional load drive circuit shown in FIG. 40 is determined by channel conductance gm of the MOS transistor, and it has been difficult to make the speed higher. Further, if a threshold voltage Vth is not lowered corresponding to lowering of the power supply voltage, the operation speed is reduced. However, there is also such a disadvantage that, when the threshold voltage is lowered, the subthreshold current becomes larger and power consumption is increased. In particular, such a problem is posed in a DRAM that the current at time of stand-by is increased, thus making operation with low power consumption such as backup with a battery difficult. See for example U.S. Pat. No. 4,916,389.

It is a first object of the present invention to provide a semiconductor integrated circuit device in which disagreement of logical thresholds is not produced even if an external power supply voltage fluctuates.

It is a second object of the present invention to provide a semiconductor integrated circuit device which is capable of high-speed operation even at a low logical amplitude.

It is a third object of the present invention to provide a semiconductor integrated circuit device provided with a load drive circuit which operates stably and at a high speed even at a low voltage.

In order to achieve the above-mentioned first object, a semiconductor integrated circuit device according to an aspect of the present invention comprises means for generating an intermediate voltage (VMM) obtained by dividing first and second external power supply voltages (VCC, VSS) at a predetermined ratio, means for generating a first internal power supply voltage between the first external power supply voltage and the above-mentioned intermediate voltage, and means for generating a second internal power supply voltage between the second external power supply voltage and the above-mentioned intermediate voltage, wherein both the first and the second internal power supply voltages are stabilized with the above-mentioned intermediate voltage as a reference. Furthermore, it is desirable that setting is made so that both the logical threshold of a circuit operating on the first and the second external power supply voltages as a power supply and the logical threshold of a circuit operating on the first and the second internal power supply voltages as a power supply are equal to above-mentioned intermediate voltage. Moreover, it is desirable that above-mentioned predetermined ratio is 1:1, i.e., the above-mentioned intermediate voltage is an average of the first and the second external power supply voltages.

In order to achieve the above-mentioned second object, a semiconductor integrated circuit device according to another aspect of the present invention includes a first and a second level conversion circuits each converting an input signal into a signal having a logical amplitude larger than the logical amplitude of the input signal, and applies the outputs of the above-mentioned first and second level conversion circuits to gates of output MOSFETs.

Thus, the logical threshold of the circuit operating on the external power supply voltage and the logical threshold of the circuit operating on the internal power supply voltage become to vary by the same quantity by stabilizing the first and the second internal power supply voltages with the intermediate voltage as a reference, when the first external power supply voltage fluctuates and when the second external power supply voltage fluctuates. Hence, no disagreement is produced between logical thresholds of both circuits. Further, the transfer conductances of the output MOSFETs becomes larger and the operation speed is improved by applying signals having a large logical amplitudes to the gates of the output MOSFETs.

In order to achieve the above-mentioned third object, in a semiconductor integrated circuit device according to another aspect of the present invention, a voltage VCH at an ordinary operating voltage VCC or higher is outputted temporarily, and is returned to the original power supply voltage VCC thereafter. This is due to the fact that, when it is assumed that the logical threshold of a circuit at the next stage is at 1.5 V at the power supply voltage VCC=3 V and VCH=4 V, the time required to reach to 1.5 V is shorter than the time required for charging toward VCC because the output is charged rapidly toward VCH. The rising side has been described, but high speed is realizable in a similar manner on the falling side when a voltage VSL lower than the ordinary operating voltage VSS is employed. Further, since a voltage higher (lower) that the ordinary operating voltage can be applied to the gate of a MOS transistor at the next stage, it is possible to aim at stable operation at a low voltage.

With this, effective gm of the MOS transistor is increased, thus enabling it to aim at high speed and also to prevent speed reduction at the time of operation at a low voltage.

BRIEF DESCRIPTION OF THE DRAWINGS

FIG. 14 is a circuit diagram of voltage limiter circuits used in the present invention;

FIG. 40 shows a conventional circuit;

DESCRIPTION OF THE PREFERRED EMBODIMENTS

Embodiments of the present invention will be described hereinafter with reference to the drawings. A semiconductor integrated circuit device using CMOS techniques principally will be cited in the following description, but the present invention is also applicable to a semiconductor integrated circuit device using other techniques.

Embodiment 1

Figure 1:
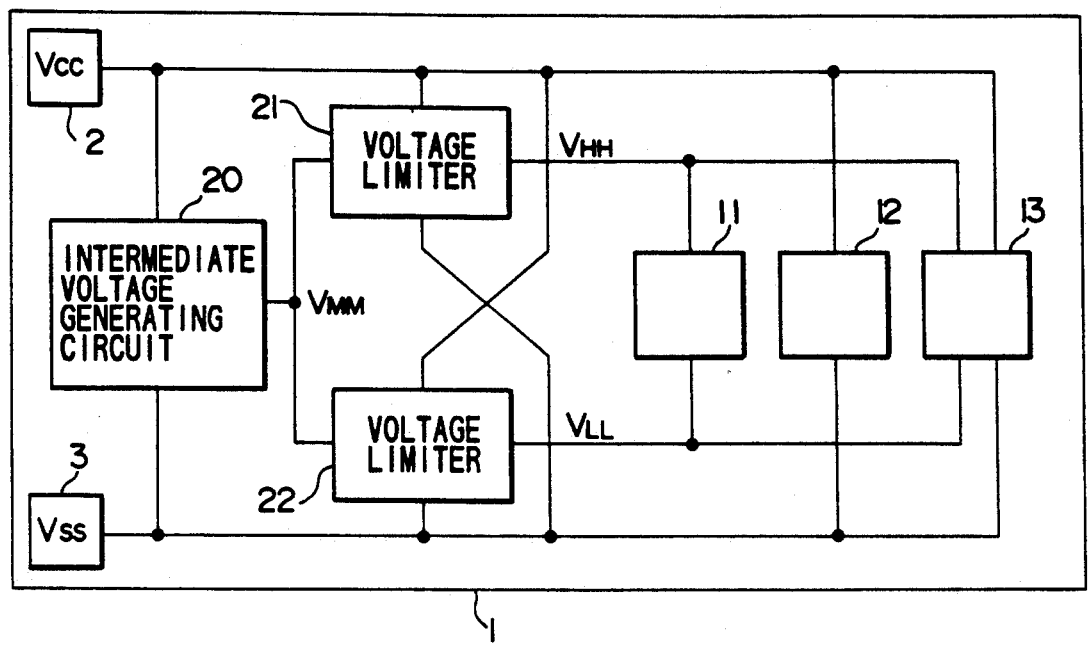
FIG. 1 is a block diagram showing an embodiment of a semiconductor device of the present invention.

FIG. 1 shows a structure of a first embodiment of a semiconductor integrated circuit device of the present invention. In FIG. 1, a reference numeral 1 represents a semiconductor chip, 2 represents a terminal for a first external power supply voltage VCC, 3 represents a terminal for a second external power supply voltage (ground voltage) VSS, 20 represents an intermediate voltage generating circuit for generating a voltage VMM intermediate between VCC and VSS, and 21 and 22 represent voltage limiters for generating internal power supply voltages VHH and VLL, respectively. 11 represents a circuit operating on VHH and VLL as the power supply, 12 represents a circuit operating on VCC and VSS as the power supply, and 13 represents a circuit operating on VHH, VLL, VCC and VSS as the power supply. Besides, it is not required for the semiconductor integrated circuit to include all of the circuits 11, 12 and 13 as shown in embodiments described later. Further, the circuit 11, 12 or 13 may use the intermediate voltage VMM as the power supply.

The present embodiment is featured in that an intermediate voltage generating circuit 20 is provided and the voltage limiters 21 and 22 stabilize VHH and VLL with the output VMM thereof as reference, which will be described with reference to the drawings.

Figure 2:
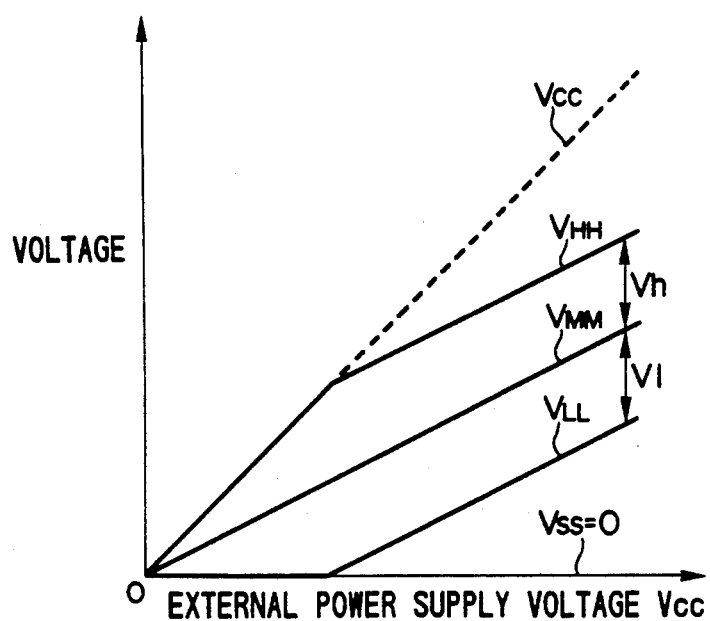
FIG. 2 is a graph showing d.c. characteristics of an embodiment of the present invention.
Figure 3A:
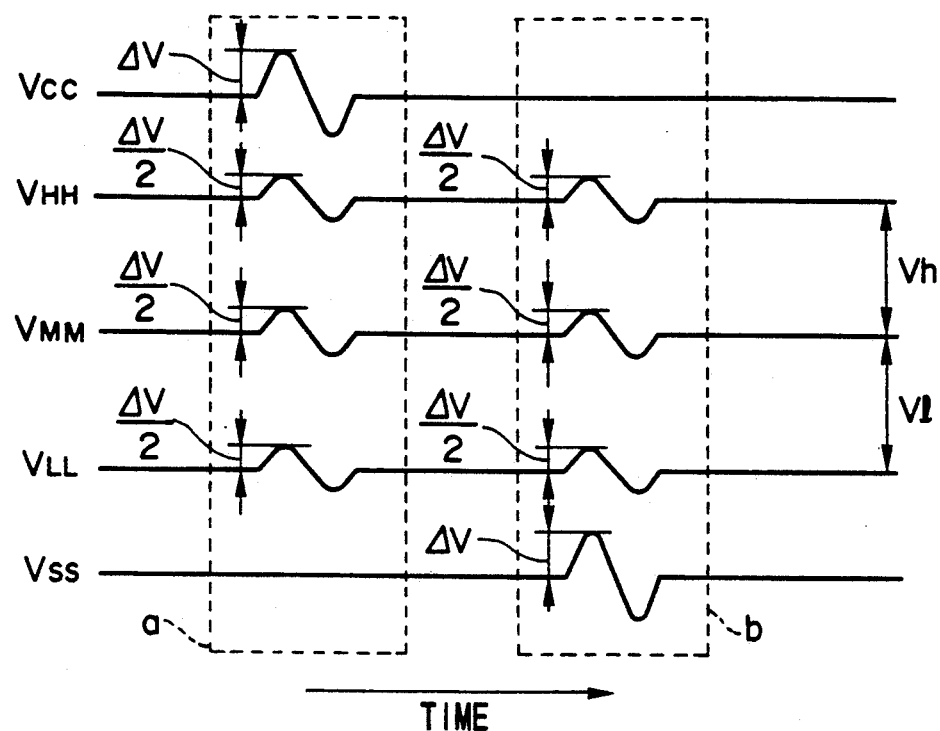
FIG. 3(a) and 3(b) show operating waveform diagrams of an embodiment of the present invention.
Figure 3B:
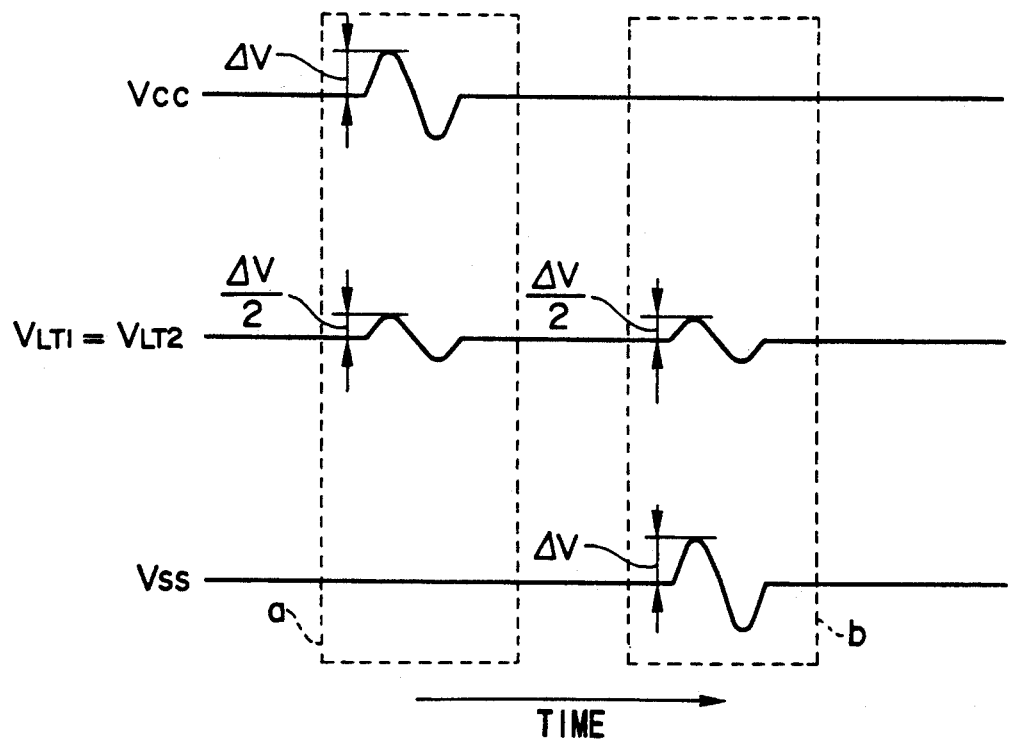

FIG. 2 is a graph obtained by plotting (at VSS = 0) an example of the relationship between the external power supply voltage VCC and respective voltages. The intermediate voltage VMM is obtained by dividing VCC−VSS at a predetermined ratio. Here, VMM is equal to a mean value of VCC and, VSS Both internal power supply voltages VHH and VLL are stabilized with VMM as reference. Namely, potential difference vh = VHH − VMM and vl = VMM − VLL are held constant. Here, vh = vl, i.e., VMM = (VHH+VLL)/2. FIG. 3 shows operating waveforms when the external power supply voltage fluctuates. In FIG. 3, a shows a case when VCC fluctuates and b shows a case when VSS fluctuates, and fluctuations of the output VMM of the intermediate voltage generating circuit, outputs VHH and VLL of the voltage limiters, and logical thresholds VLT1 and VLT2 of the circuits 11 and 12 in respective cases are shown. When a signal is transferred between the circuits 11 and 12, it is desirable that logical thresholds of both circuits are in accord with each other. Here, the logical thresholds in case of no power supply fluctuation are set at VLT1=VLT2=VMM. Namely, the logical threshold of the circuit 11 is set at the center between the internal power supply voltages VHH and VLL, and the logical threshold of the circuit 12 is set at the center between the external power supply voltages VCC and VSS, respectively.

First, a case when VCC fluctuates by ΔV will be described. Since VMM is equal to a mean value of VCC and VSS, the variation of VMM is at ΔV/2. Since both VHH and VLL are stabilized with VMM as reference, both vary by ΔV/2. Accordingly, the logical threshold VLT1 of the circuit 11 also varies by ΔV/2. On the other hand, since the logical threshold VLT2 of the circuit 12 is at the center between VCC and VSS, it varies by ΔV/2. Next, a case when VSS varies by ΔV will be described. Since the variation of VMM is also at ΔV/2 in this case, VHH, VLL and VLT1 vary by ΔV/2, respectively. On the other hand, the logical threshold VLT2 of the circuit 12 varies by ΔV/2. Namely, in either case, the variations of the logical thresholds of the circuit 11 and the circuit 12 are equal to each other, and disagreement is not produced as heretofore experienced in a conventional example. Thus, noises are not generated even when the external power supply voltage fluctuates, and reliability of the circuit is ensured.

Figure 4A:
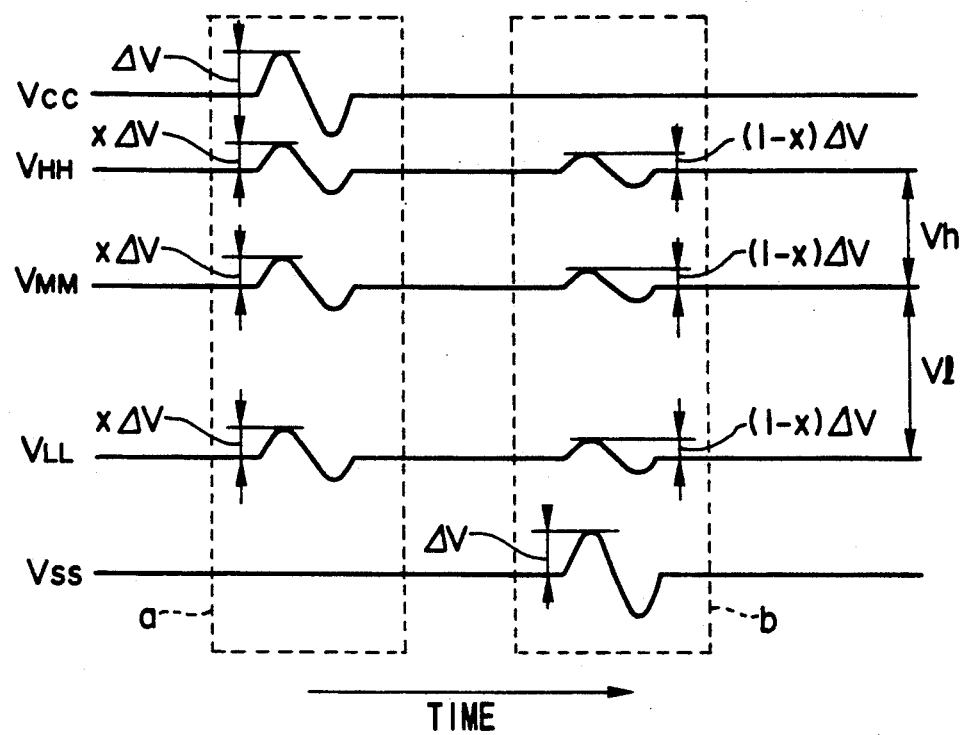
FIG. 4(a) and 4(b) show operating waveform diagrams of an embodiment of the present invention.
Figure 4B:
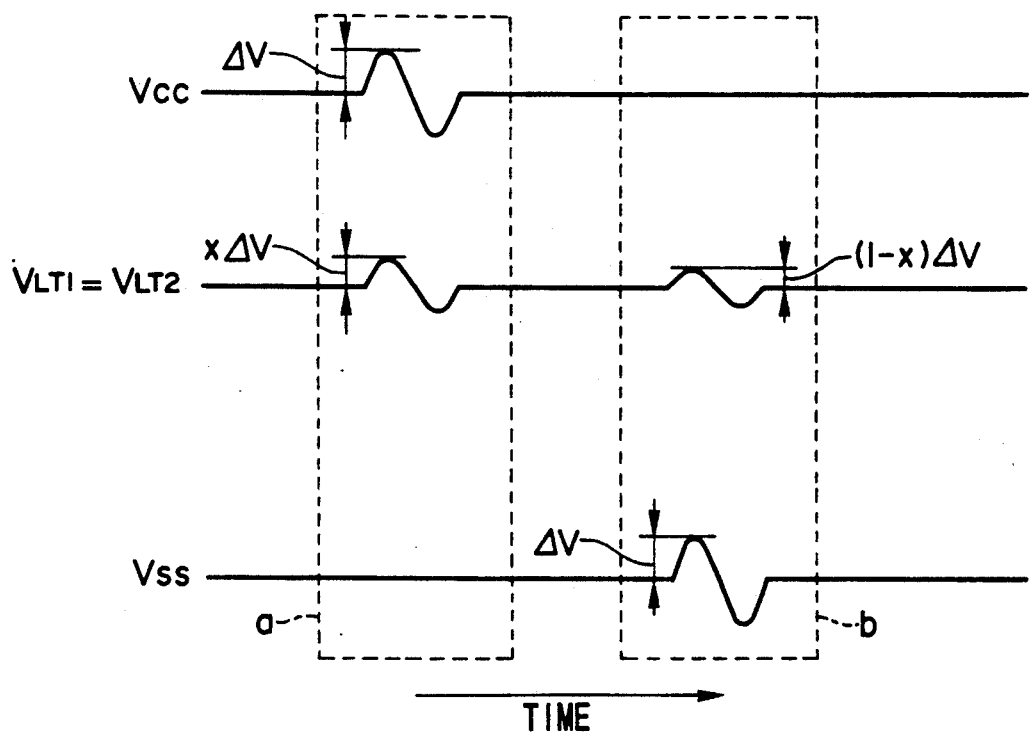

VMM=(VCC+VSS)/2 and vh=vl are assumed in FIG. 2 and FIG. 3 for the sake of simplicity, but such a condition is not necessarily required. Only if the logical thresholds VLT1 and VLT2 of the circuits 11 and 12 are set equal to the intermediate voltage VMM, variations of VLT1 and VLT2 are always equal to each other even if the external power supply voltage fluctuates. This is explained with reference to FIG. 4.

First, x is set at x=(VMM−VSS)/(VCC−VSS). Namely, the intermediate voltage VMM is set at a point where VCC−VSS is divided at (1−x):x (FIG. 2 and FIG. 3 show the case of x=0.5). When VCC varies by ΔV, the intermediate voltage VMM varies by xΔV. Since both VHH and VLL are stabilized with VMM as reference, both vary by xΔV. Since both the power supplies VHH and VLL of the circuit 11 vary by xΔV, the logical threshold VLT1 varies by xΔV (irrespective of the magnitude relationship between vh and vl). On the other hand, since the logical threshold VLT2 of the circuit 12 is equal to VMM, that is, set at a point where VCC−VSS is divided at (1−x):x, VLT2 varies by xΔV. Thus, the variations of the logical thresholds VLT1 and VLT2 are equal to each other. The same is applied to a case when VSS varies by ΔV, and both logical thresholds VLT1 and VLT2 vary by (1−x)ΔV.

As described above, voltages VMM, VHH and VLL may be set freely to some extent, but it is recommended to establish VMM=(VCC+VSS)/2 and vh=vl as shown in FIG. 2 and FIG. 3 from a viewpoint of noise margin. Because, the noise margin generally becomes the largest when the logical threshold is set at the center of the logical amplitude.

The advantage of the present invention has been described above with respect to a case when signals are transferred among circuits in one chip. Next, a case when signals are transferred among a plurality of chips will be described.

Figure 5A:
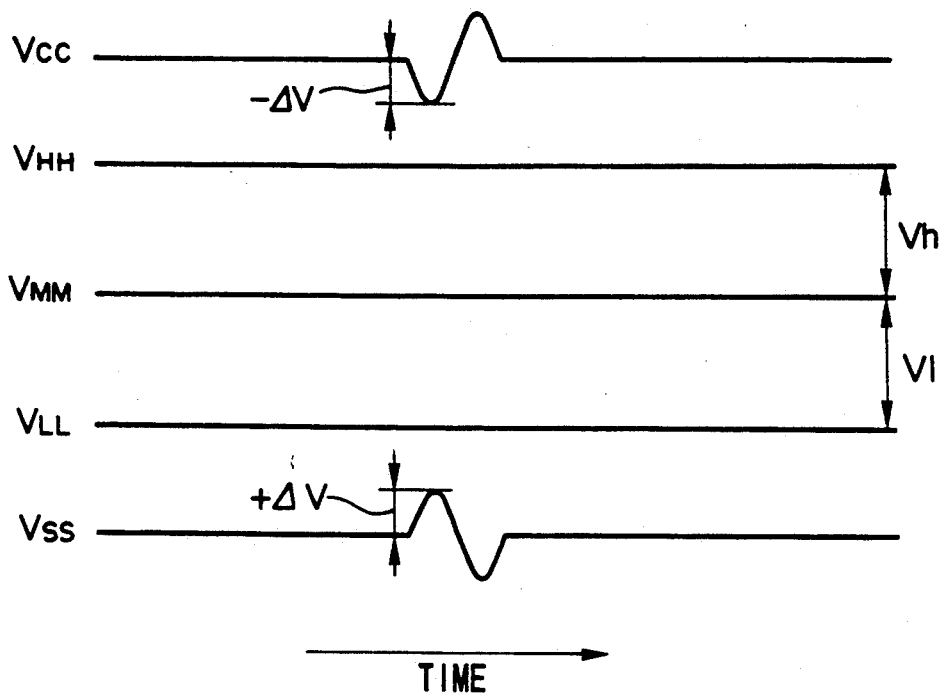
FIG. 5(a) and 5(b) show operating waveform diagrams of an embodiment of the present invention.
Figure 5B:
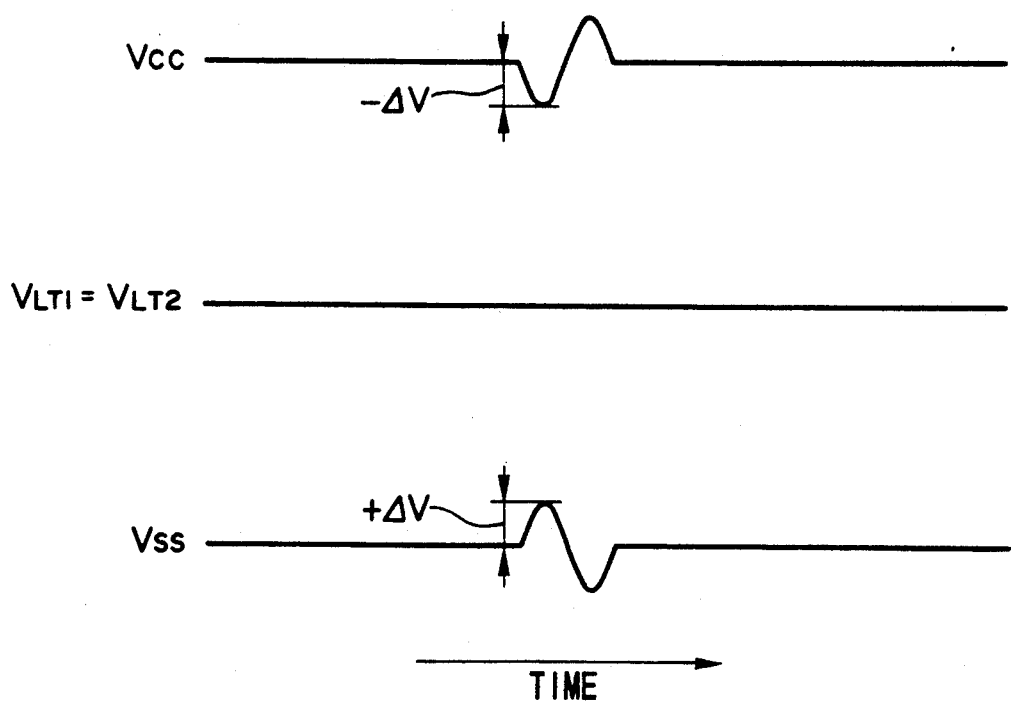

First, a fact that a semiconductor integrated circuit device according to the present invention is durable against power supply voltage fluctuation in a reverse phase will be described with reference to FIG. 5. The power supply voltage fluctuation in a reverse phase means such voltage fluctuation that absolute values of quantities of fluctuations of VCC and VSS are equal and opposite in direction as shown in FIG. 5(a). The case of VMM=(VCC+VSS)/2 and vh=vl will be described similarly to FIG. 2 and FIG. 3 for the sake of simplicity. When VCC varies by −ΔV simultaneously with the variation of VSS by +ΔV, VMM does not vary. Therefore, VHH and VLL do not vary, neither varies the logical threshold VLT1 of the circuit 11. On the other hand, since the logical threshold VLT2 of the circuit 12 is at the center between VCC and VSS, it varies neither. Namely, even when the power supply voltage fluctuates, disagreement between the logical thresholds VLT1 and VLT2 is not only produced, but also the absolute values thereof do not vary at all so far as the fluctuation is in a reverse phase.

Practically, it happens frequently that VCC and VSS fluctuate in a reverse phase to each other when semiconductor integrated circuit devices are packaged on a substrate. The reason will be explained with reference to FIG. 6.

Figure 6:
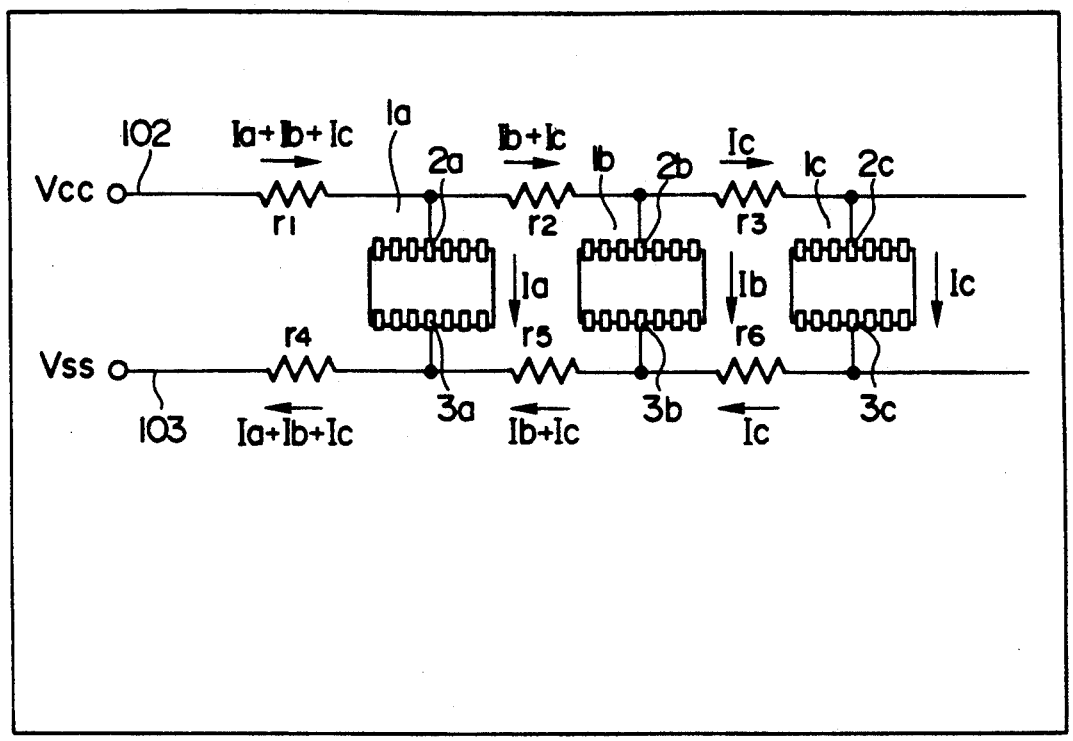
FIG. 6 is a diagram showing a packaged state of a semiconductor device of the present invention.

FIG. 6 is a diagram showing a state that semiconductor integrated circuit devices are packaged on a substrate 100. In FIG. 6, 1a, 1b and 1c represent semiconductor integrated circuit devices according to the present invention, 2a, 2b and 2c represent terminals for the first external power supply voltage VCC of respective semiconductor integrated circuit devices, and 3a, 3b and 3c represent terminals for the second external power supply voltage (ground voltage) VSS of respective semiconductor integrated circuit devices. Although it is not shown, it is assumed that signals are transferred among 1a, 1b and 1c. 102 represents a wiring for VCC, r1 to r3 represent parasitic resistances thereof, 103 represents a wiring for VSS, and r4 to r6 represent parasitic resistances thereof. When the wiring for VCC and the wiring for VSS have the same width and are parallel to each other, it can be considered that r1≈r4, r2≈r5 and r3≈r6. When it is assumed that the currents flowing in respective semiconductor integrated circuit devices 1a, 1b and 1c are Ia, Ib and Ic, respectively, Ia+Ib+Ic flows in r1 and r4, Ib+Ic flows in r2 and r5, and Ic flows in r3 and r6, respectively. Accordingly, potentials at the terminals 2a, 2b and 2c become lower than VCC by ΔV1=r1(Ia+Ib+Ic), ΔV2=r1(Ia+Ib+Ic)+r2(Ib+Ic) and ΔV3=r1(Ia+Ib+Ic)+r2(Ib+Ic)+r3Ic, respectively. Further, potentials at the terminals 3a, 3b and 3c become higher than VSS by ΔV4=r4(Ia+Ib+Ic), ΔV5=r4(Ia+Ib+Ic)+r5(Ib+Ic) and ΔV6=r4(Ia+Ib+Ic)+r5(Ib+Ic)+r6Ic, respectively. Here, since r1≈r4, r2≈r5 and r3≈r6, ΔV1≈ΔV4, ΔV2≈ΔV5 and ΔV3≈ΔV6. Even if the currents Ia, Ib and Ic vary time-wise, these relationships remain the same. Namely, the power supply voltage fluctuations of respective semiconductor integrated circuit devices always occurs in an almost reverse phase although the absolute values are different from chip to chip.

As described previously, the logical thresholds of the circuits in the semiconductor integrated circuit devices 1a, 1b and 1c do not vary at all even when the power supply voltage fluctuates in a reverse phase. Therefore, even in case where signals are transferred among 1a, 1b and 1c, disagreement of the logical threshold will never be produced among the circuits. With this, reliability as the whole system in which a plurality of semiconductor integrated circuit devices are packaged may be secured.

Figure 7:
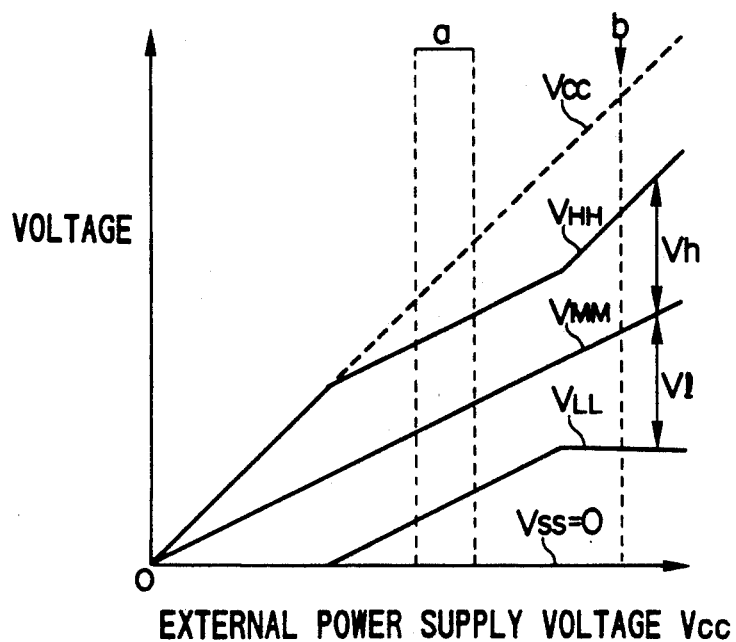
FIG. 7 is a graph showing d.c. characteristics of an embodiment of the present invention.

FIG. 7 is a graph obtained by plotting another example of the relationship between the external power supply voltage VCC and respective voltages. The point of difference from FIG. 2 exists in characteristics of the internal power supply voltages VHH and VLL in a region where the external power supply voltage is high. When the external power supply voltage VCC falls within the ordinary operation range (shown at a in the figure), the internal power supply voltages VHH and VLL are stabilized with VMM as reference and the potential differences vh and vl are constant as described previously. In a region where VCC is high, however, VHH is stabilized with VCC as reference, and VLL is stabilized with VSS as reference, respectively, and vh and vl become larger than constant values, respectively. With this, it becomes possible to perform an aging (burn-in) test of the circuits (circuits 12 and 13 in FIG. 1) operating on the internal power supply voltage. By making the external power supply voltage VCC higher than that in an ordinary operating state (for example, b in the figure), vh and vl also become larger than those in the ordinary operating state. With this, voltages higher than those in the ordinary operating state are applied to the circuits 11, 12 and 13, respectively.

Embodiment 2 to Embodiment 5

Figure 8:
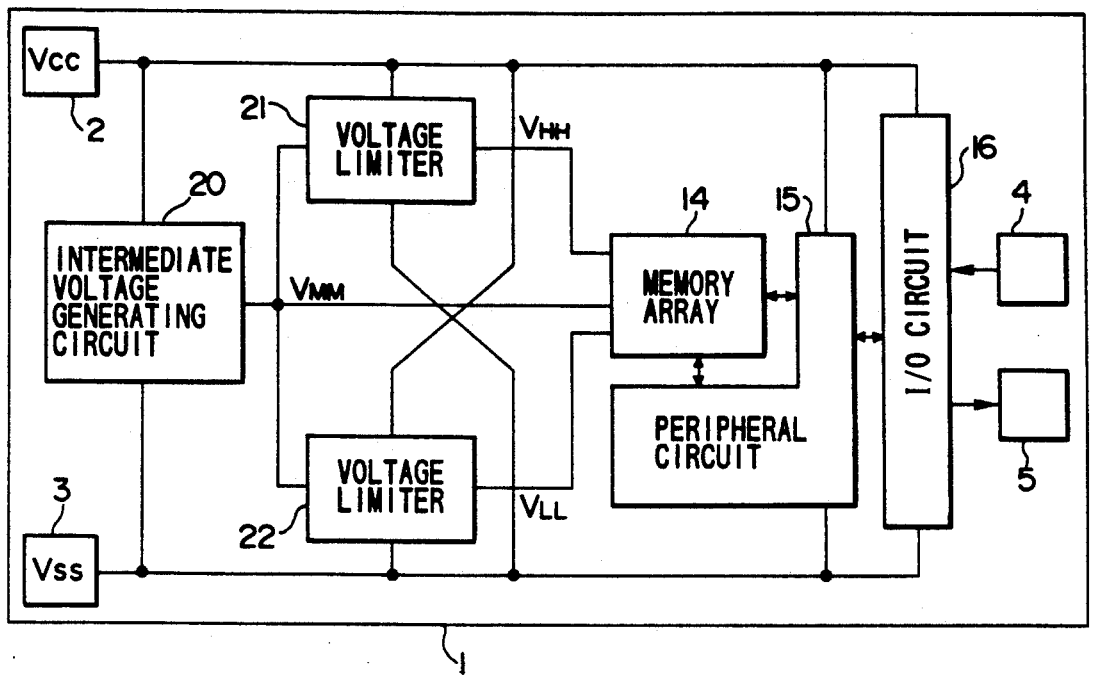
FIG. 8 is a block diagram showing an embodiment of a semiconductor device of the present invention.

In the next place, examples in which the present invention are applied to a memory LSI is shown. FIG. 8 shows such an example, in which 4 represents an input terminal, 5 represents an output terminal, 14 represents a memory array, 15 represents a peripheral circuit and 16 represents an input-output circuit. The memory array 14 operates on internal power supply voltages VHH and VLL, and the peripheral circuit 15 and the input-output circuit 16 operate on external voltages VCC and VSS. Namely, the memory array corresponds to the circuit 11 in FIG. 1, and the peripheral circuit and the input-output circuit correspond to the circuit 12 in FIG. 1. Besides, only one each of the input terminal 4 and the output terminal 5 are shown in the figure, but a plurality of terminals may be provided as a matter of course. Further, a terminal serving both as an input terminal and an output terminal may be included, too.

Figure 9:
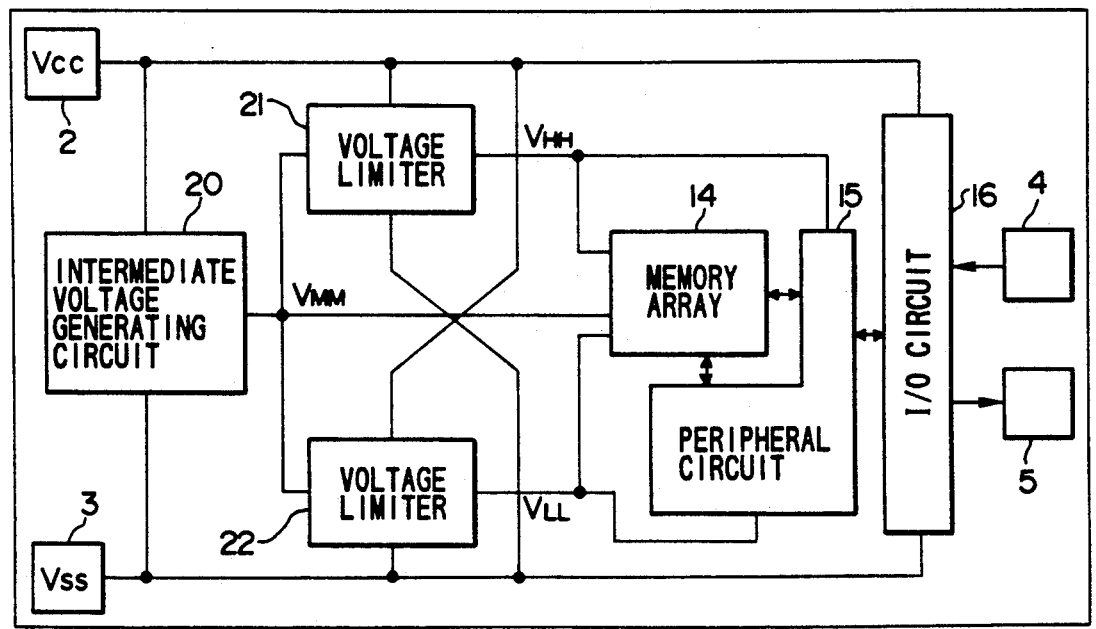
FIG. 9 is a block diagram showing an embodiment of a semiconductor device of the present invention.

FIG. 9 shows another application example of the present invention to a memory LSI. In this example, the peripheral circuit 15 operates on internal power supply voltages VHH and VLL. Namely, the memory array and the peripheral circuit correspond to the circuit 11 in FIG. 1 and the input-output circuit corresponds to the circuit 12 in FIG. 1.

Figure 10:
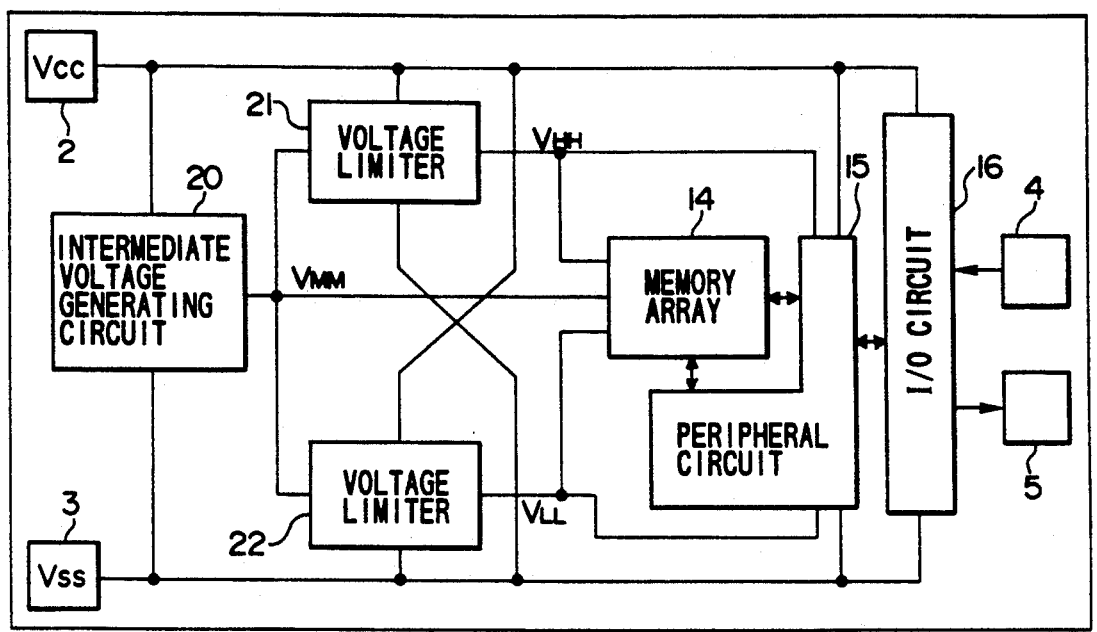
FIG. 10 is a block diagram showing an embodiment of a semiconductor device of the present invention.

FIG. 10 shows still another application example of the present invention to a memory LSI. In this example, the peripheral circuit 15 uses both external power supply voltages VCC and VSS and internal power supply voltages VHH and VLL as the power supply. Namely, the memory array corresponds to the circuit 11 in FIG. 1, the input-output circuit corresponds to the circuit 12 in FIG. 1, and the peripheral circuit corresponds to the circuit 13 in FIG. 1, respectively. As it will be described later, it is possible to fabricate a high speed circuit in low power consumption by using both the external power supply voltages VCC and VSS and the internal power supply voltages VHH and VLL.

Figure 11:
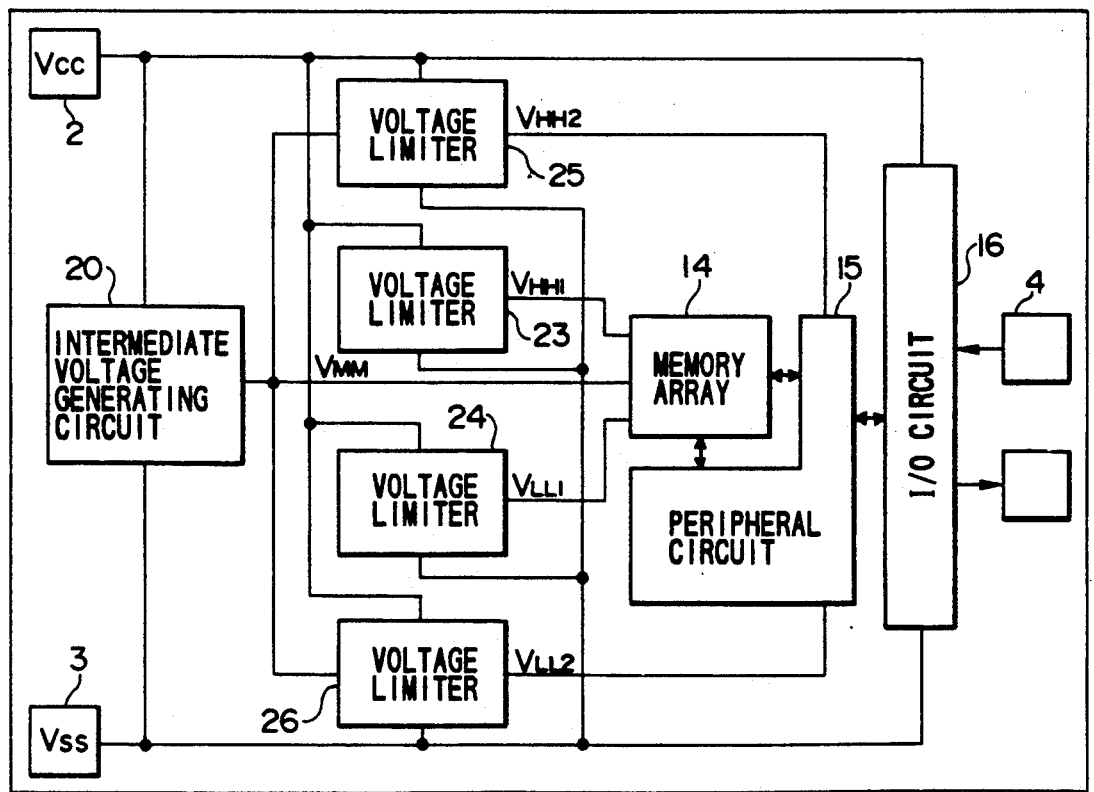
FIG. 11 is a block diagram showing an embodiment of a semiconductor device of the present invention.

FIG. 11 shows still another application example of the present invention to a memory LSI. In this example, both the memory array 14 and the peripheral circuit 15 operate on the internal power supply voltages similarly to the embodiment shown in FIG. 9, but these voltages are different. The memory array 14 operates on VHH1 and VLL1, and the peripheral circuit 15 operates on VHH2 and VLL2. Accordingly, 4 pieces in total of voltage limiter circuits (23, 24, 25, 26) are provided. All of outputs VHH1, VLL1, VHH2 and VLL2 of the voltage limiters are stabilized with the intermediate voltage VMM as reference. The present embodiment has such an advantage that the operating voltage of the memory array and the operating voltage of the peripheral circuit can be set independently to optimum values.

Embodiment 6

Figure 12:
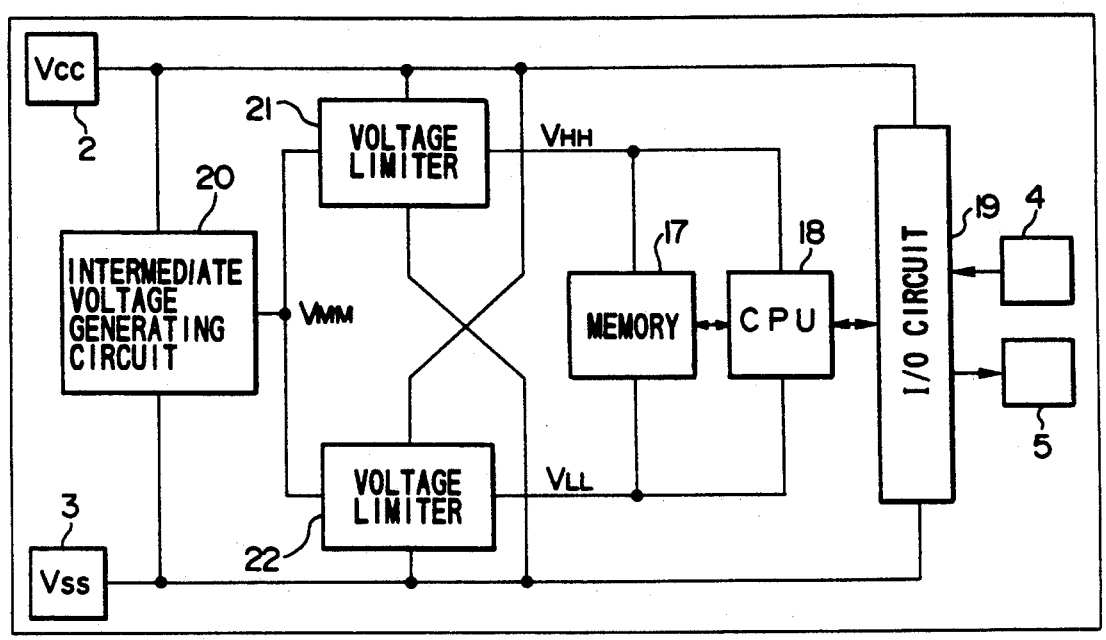
FIG. 12 is a block diagram showing an embodiment of a semiconductor device of the present invention.

FIG. 12 shows an example in which the present invention is applied to a microprocessor. In FIG. 12, 17 represents a memory, 18 represents a CPU, and 19 represents an input-output circuit. In the present example, the memory and the CPU operate on the internal power supply voltages VHH and VLL, and the input-output circuit 19 operates on the external power supply voltages VCC and VSS. Namely, the memory and the CPU correspond to the circuit 11 in FIG. 1, and the input-output circuit corresponds to the circuit 12 in FIG. 1. It is naturally allowed to have the memory or the CPU operate on the external power supply voltages VCC and VSS.

Next, element circuits used in the present invention will be described.

Intermediate voltage generating circuit

The intermediate voltage generating circuit 20 is a circuit for dividing VCC−VSS at a predetermined ratio as described previously. As to this circuit, a circuit disclosed in IEEE Journal of Solid-State Circuits, vol. 26, no. 4, pp. 465–472, Apr. 1991 for instance can be used. Otherwise, it is sufficient that VCC−VSS is only divided by resistance in case the current driving capacity of the intermediate voltage VMM may be small.

Voltage limiter circuit

Figure 13:
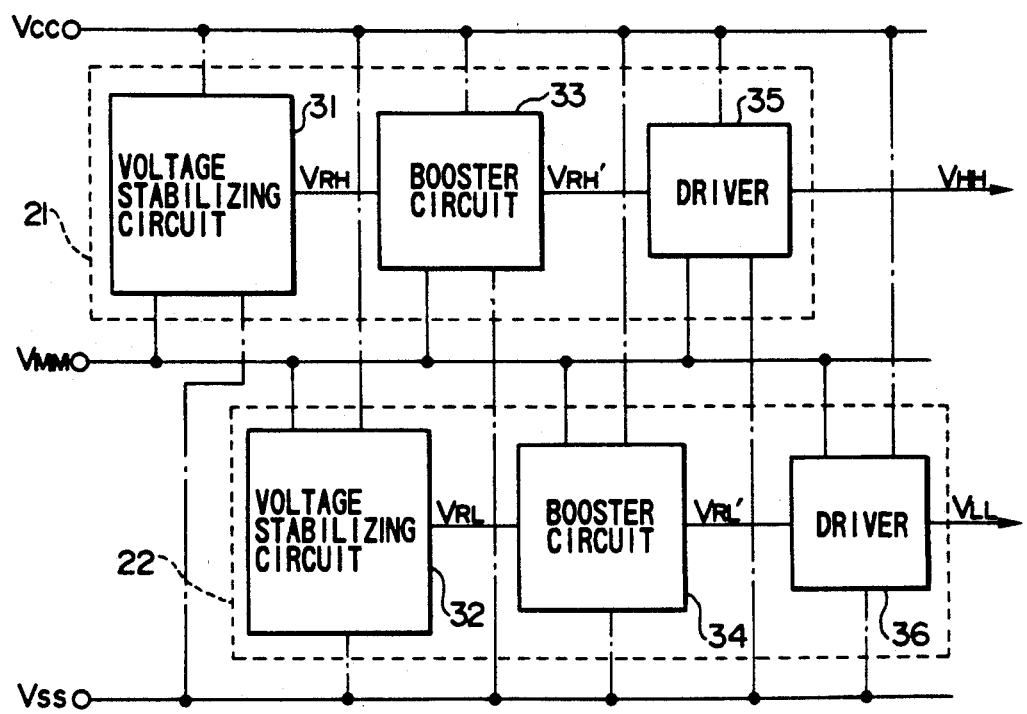
FIG. 13 is a circuit diagram of voltage limiter circuits used in the present invention.

As described previously, two types of voltage limiter circuits, one being a circuit 21 for generating a voltage VHH between the first external power supply voltage VCC and the intermediate voltage VMM and the other being a circuit 22 for generating a voltage VLL between VMM and the second external power supply voltage VSS, are used in the present invention. FIG. 13 shows an example of the structure of the voltage limiter circuits 21 and 22 for realizing d.c. characteristics shown in FIG. 2. Each of respective voltage limiter circuits includes a voltage stabilizing circuit (31 or 32), a booster circuit (33 or 34) and a driver (35 or 36). Besides, the voltage limiter circuits 23 to 26 in the embodiment shown in FIG. 11 can be realized with circuits similar to the above.

The voltage stabilizing circuit 31 is a circuit for generating a stabilized voltage VRH against fluctuations of temperature and external power supply voltage. The voltage reference is the intermediate voltage VMM. That is, VRH−VMM is maintained almost constant. The booster circuit 33 is a circuit for converting the output VRH of the voltage stabilizing circuit into VRH'. Here, the voltage reference is also the intermediate voltage VMM. Namely, VRH−VMM is converted into VRH'−VMM. When a circuit of MOSFET threshold voltage difference scheme or band gap scheme which will be described later is used as the voltage stabilizing circuit, the output voltage VRH is not necessarily an appropriate value as the internal power supply voltage. The roll of the booster circuit 33 is to convert VRH into an appropriate voltage. Accordingly, if VRH is a voltage appropriate as the internal power supply voltage by chance, the booster circuit 33 may be omitted. The driver 35 is a circuit for generating the internal power supply voltage VHH having a large current driving capacity on the basis of VRH'. The voltage level of VHH is the same as that of VRH'. Besides, the booster circuit 33 may be omitted by giving voltage converting functions to the driver 35. The voltage limiter circuit 21 has been described above, but the same is applied to the voltage limiter circuit 22.

The features of this voltage limiter circuit are such that respective circuits 31 to 36 use the intermediate voltage VMM as voltage reference (shown with solid lines in the figure), but they use the external power supply voltages VCC and VSS as the power supply (shown with dashed lines in the figure). The first advantage with the above is that respective circuits operate even on a low external power supply voltage. Referring to the voltage stabilizing circuit 31 for instance, it operates even when VCC−VSS is low more surely on VCC and VSS as the power supply than on VCC and VMM as the power supply. The second advantage is that it is possible to use a simple circuit as the intermediate voltage generating circuit 20 because the current driving capacity of the intermediate voltage VMM may as well be small.

FIG. 14 shows an example of the structure of voltage limiter circuits 21 and 22 for realizing d.c. characteristics shown in FIG. 7. Each of respective voltage limiter circuits includes two voltage stabilizing circuits (31n and 31b, or 32n and 32b), two booster circuits (33n and 33b, or 34n and 34b), a switch circuit (37 or 38), and a driver circuit (35 or 36). The circuits 31n, 32n, 33n and 34n are for ordinary operation, and the circuits 31b, 32b, 33b and 34b are for aging test.

The roles of the voltage stabilizing circuit 31n and the booster circuit 33n are the same as those in the circuits 31 and 33 shown in FIG. 13. That is, a stabilized voltage VRHN' is generated with the intermediate voltage VMM as reference. On the other hand, the voltage stabilizing circuit 31b and the booster circuit 33b generate a stabilized voltage VRHB' with the external power supply voltage VCC as reference. The switch circuit 37 selects VRHN' at the time of normal operation and selects VRHB' at the time of aging test. When it is arranged so as to select a higher voltage out of VRHN' and VRHB' as disclosed in JP-A-1-85461, the characteristics shown in FIG. 7 are obtainable. The voltage limiter circuit 21 has been described above, but the same is applied to the voltage limiter circuit 22. Here, it is sufficient to arrange so that the switch circuit 38 selects a lower voltage out of VRLN' and VRLB'.

Next, concrete circuit examples will be described.

Voltage stabilizing circuit

Figure 15A:
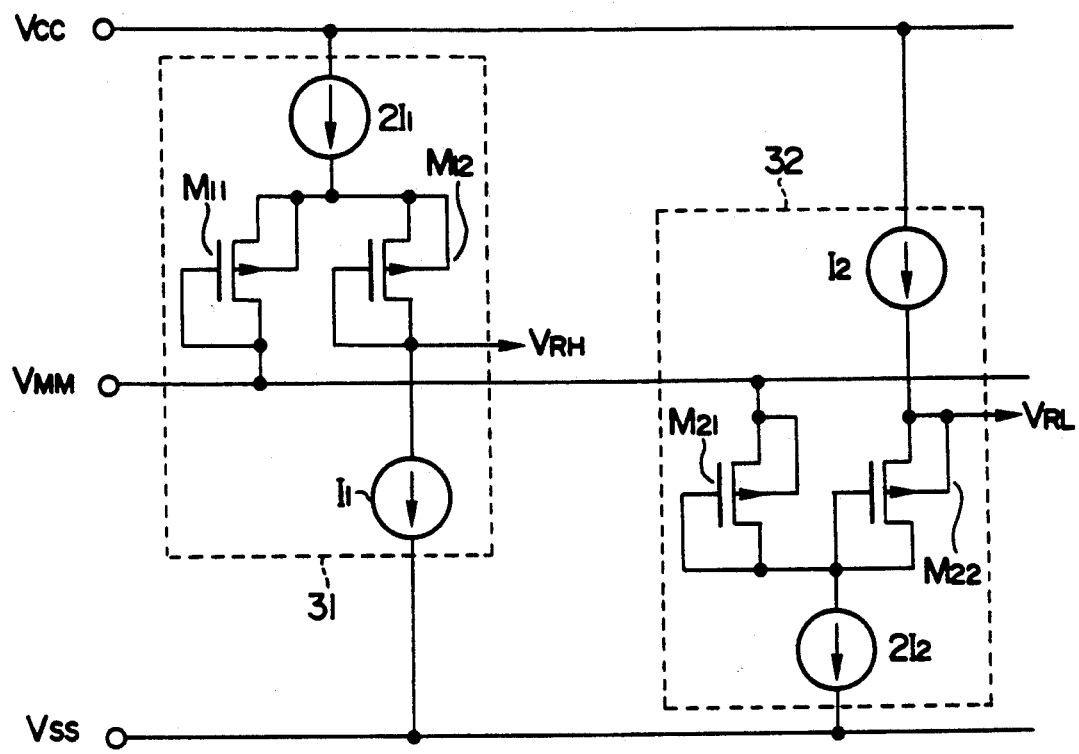
FIG. 15(a) and 15(b) show circuit diagrams of voltage stabilizing circuits used in the present invention.

FIG. 15(a) shows an example of the voltage stabilizing circuits 31 and 32. These are circuits for taking out the difference in threshold voltages of two P-channel MOSFET's. When it is assumed that the threshold voltage of M11 and M21 is V1 and the threshold voltage of M12 and M22 is V2 (V1<V2<0), $VRH = VMM + |V1| - |V2|$ and $VLH = VMM - |V1| + |V2|$ are obtained. The feature of this circuit is that current sources I1 and I2 are connected to the external power supply voltages VSS and Vcc, respectively, in place of VMM. This is done because of the following reasons.

An ideal current source can flow a constant current irrespective of the voltage across both the ends thereof, but an actual circuit does not operate as a current source unless the voltage across both ends thereof is at a certain value or higher. It is possible to make the voltage across both ends higher by the portion (VMM−VSS) when the current source I1 is connected to VSS rather than to connect it to VMM. In other words, it is possible to have the current source operate even in a region where VCC−VSS is low. The same is applied to the current source I2.

Figure 15B:
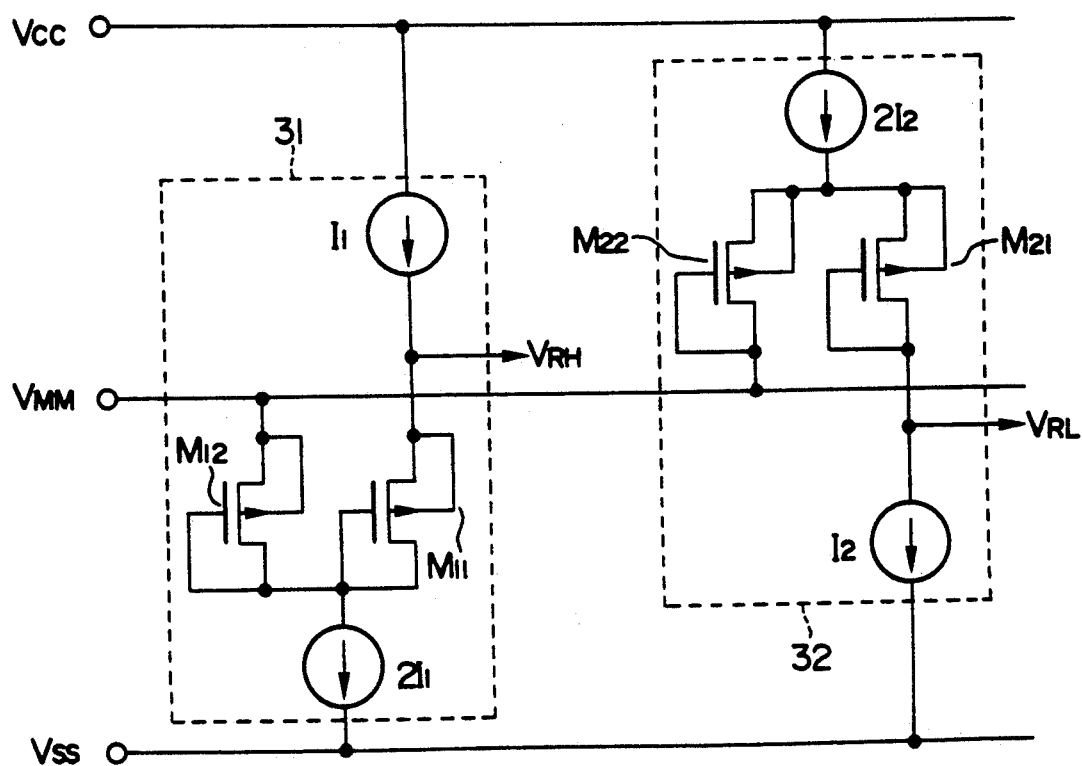

FIG. 15(b) also shows a similar circuit, in which $VRH = VMM - |V2| + |V1|$ and $VLH = VMM + |V2| - |V1|$.

Booster circuit

Figure 16:
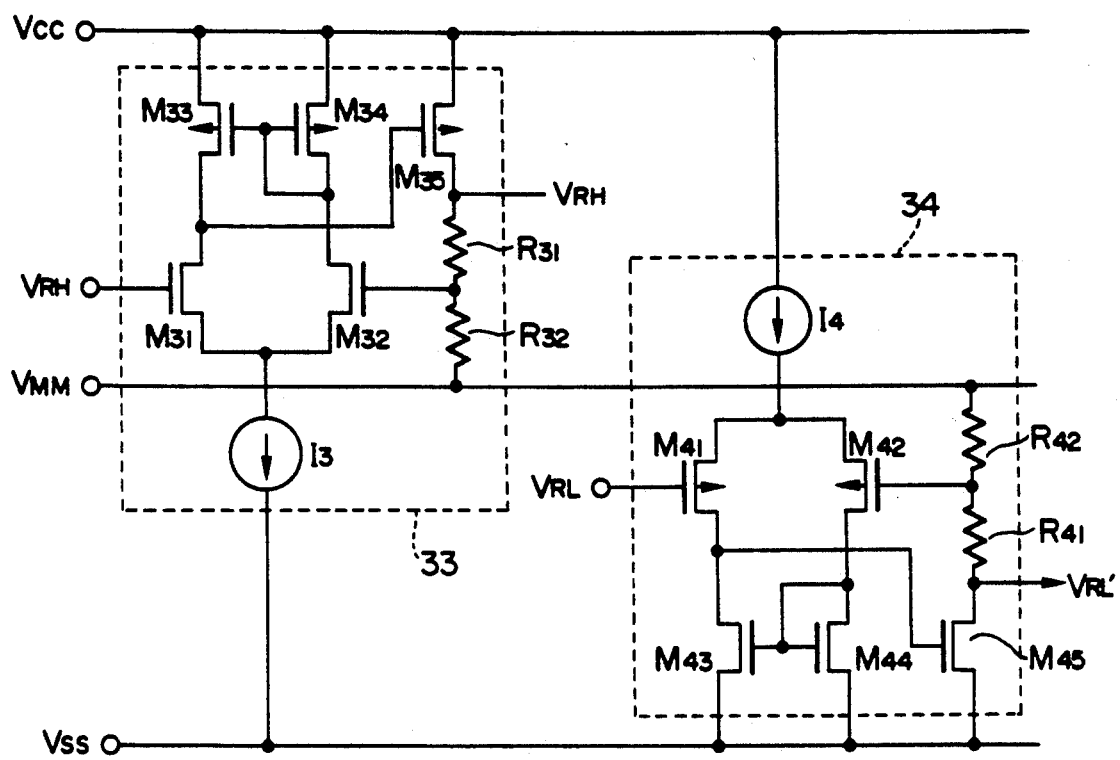
FIG. 16 is a circuit diagram of booster circuits used in the present invention.

FIG. 16 shows an example of booster circuits 33 and 34. The booster circuit 33 is composed of a differential amplifier consisting of MOSFET's M31 to M34 and a current source I3 and an output stage consisting of a MOSFET M35 and resistances R31 and R32. The output voltage VRH' of the booster circuit is expressed by $VRH' - VMM = (VRH - VMM)(R31 + R32)/R32$. Namely, the voltage is multiplied by (R31+R32)/R32 with the intermediate voltage VMM as reference. Besides, if the ratio of the resistance R31 to the resistance R32 is made variable, fine adjustment, what is called trimming, of the voltage VRH' becomes possible. The feature of this circuit is that the current source I3 is connected to the external power supply voltage VSS in place of VMM. With this, it is possible to have the booster circuit operate in a region where VCC−VSS is low. The booster circuit 33 has been described above, but the same is applied to the booster circuit 34.

Driver

Figure 17:
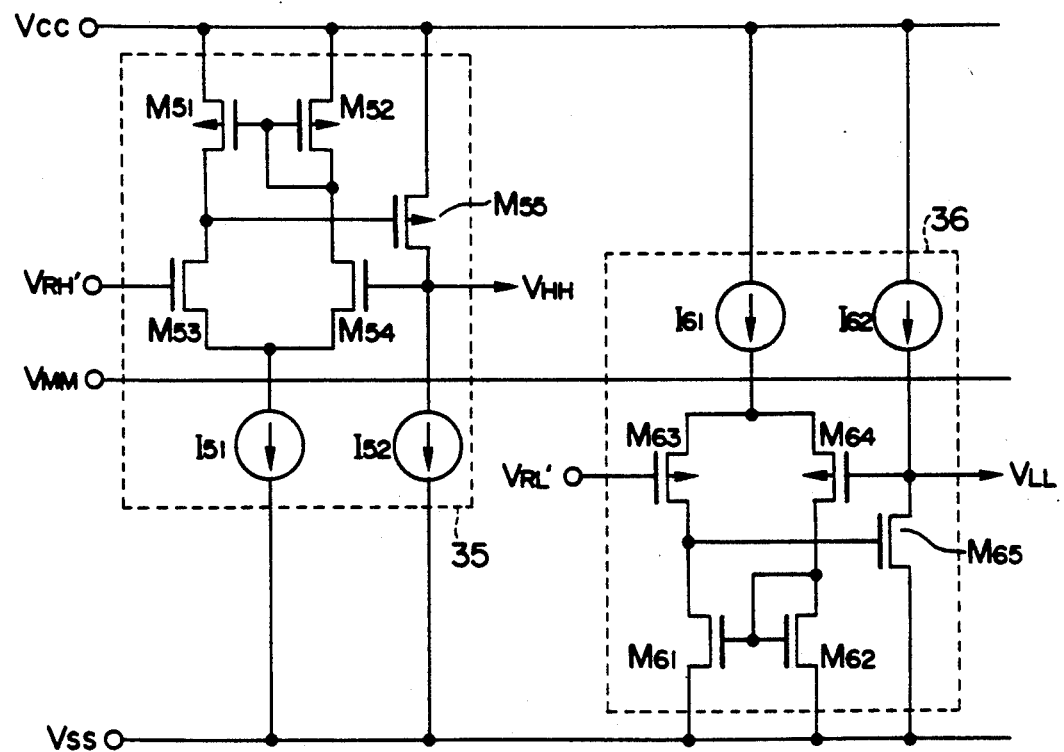
FIG. 17 is a circuit diagram of driver circuits used in the present invention.

FIG. 17 shows an example of drivers 35 and 36. The driver 35 is composed of a differential amplifier including MOSFET's M51 to M54 and a current source I51, and an output stage including a MOSFET M55 and a current source I52. The output voltage VHH of the driver is equal to VRH'. The feature of this circuit is that the current sources I51 and I52 are connected to the external power supply voltage VSS in place of VMM. With this, it is possible to have the driver operate in a region where VCC−VSS is low. The driver 35 has been described above, but the same is applied to the driver 36.

Inverter circuit

Figure 18:
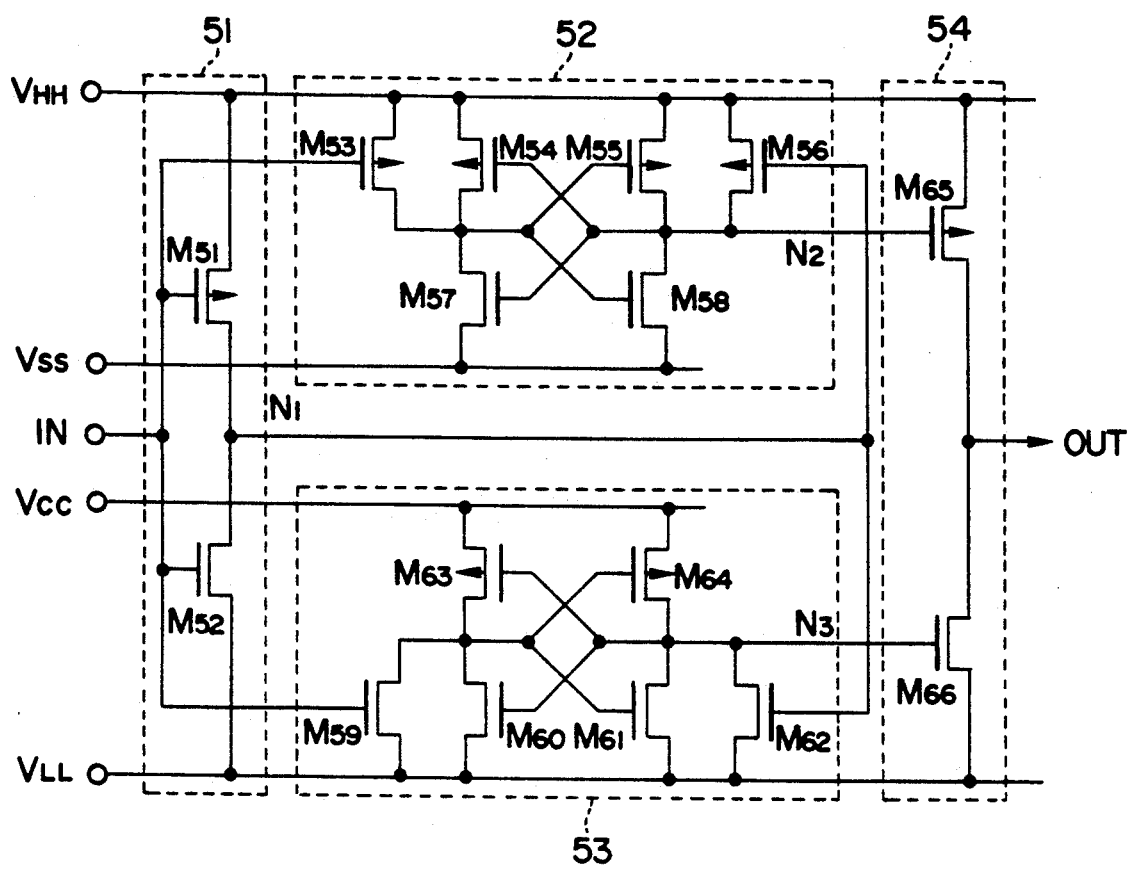
FIG. 18 is a circuit diagram showing an embodiment of an inverter circuit of the present invention.

Next, an example of a circuit capable of high speed operation even at a low logical amplitude, which is the second object of the present invention, will be shown. FIG. 18 shows an inverter circuit. This circuit consists of a CMOS inverter 51, two level converting circuits 52 and 53, and an output stage 54. The feature of this circuit is that both logical amplitudes of input and output are VHH−VLL, but that voltages larger than the logical amplitude are applied to the gates of two MOSFET's constituting the output stage. With this, the current driving capacity of the output stage is increased, and the delay time is reduced. Moreover, since the logical amplitude of the output is small, it is possible to suppress power consumption due to charge and discharge of the load capacitor.

Figure 19:
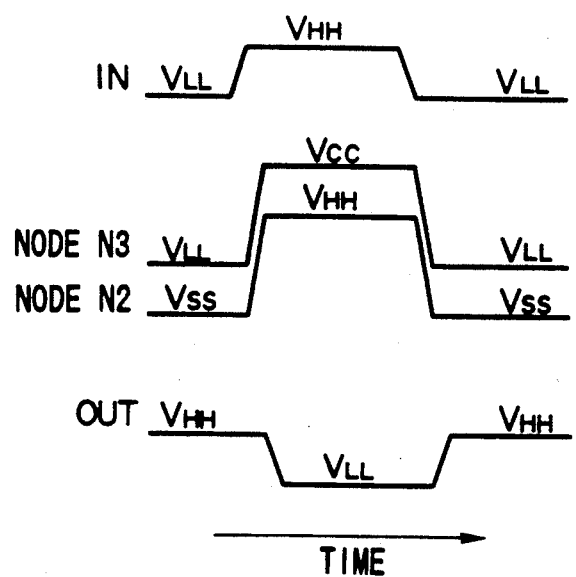
FIG. 19 shows operating waveforms of the inverter shown in FIG. 18.

FIG. 19 shows operating waveforms of this circuit. The logical amplitude of an input signal IN is VHH−VLL. Since the power supplies of the CMOS inverter 51 are VHH and VLL, the amplitude of an output N1 thereof is also VHH−VLL. The level converting circuit 52 sets the low level to VSS while keeping the high level of the input signal intact. Since an output N2 thereof is applied to the gate of a P-channel MOSFET M65 at the output stage, the current driving capacity of M65 is increased. On the other hand, the level converting circuit 53 sets the high level to VCC while keeping the low level of the input signal intact.

Since an output N3 thereof is applied to the gate of an N-channel MOSFET M66 at the output stage, the current driving capacity of M66 is increased.

Figure 20:
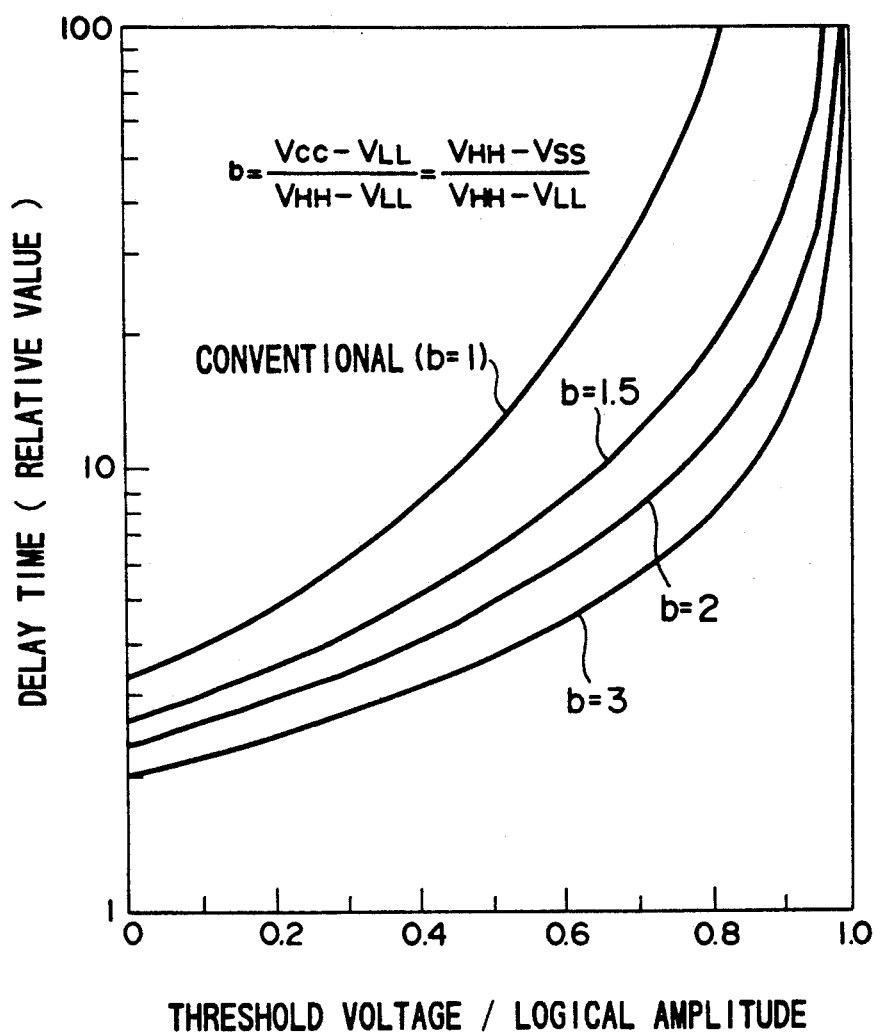
FIG. 20 is a graph showing delay time of the inverter shown in FIG. 18.
Figure 21:
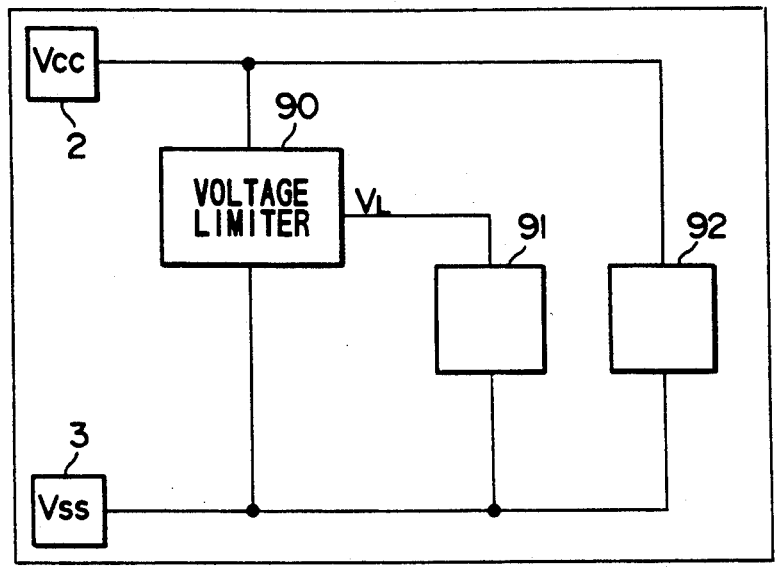
FIG. 21 is a block diagram of a conventional semiconductor device.
Figure 22:
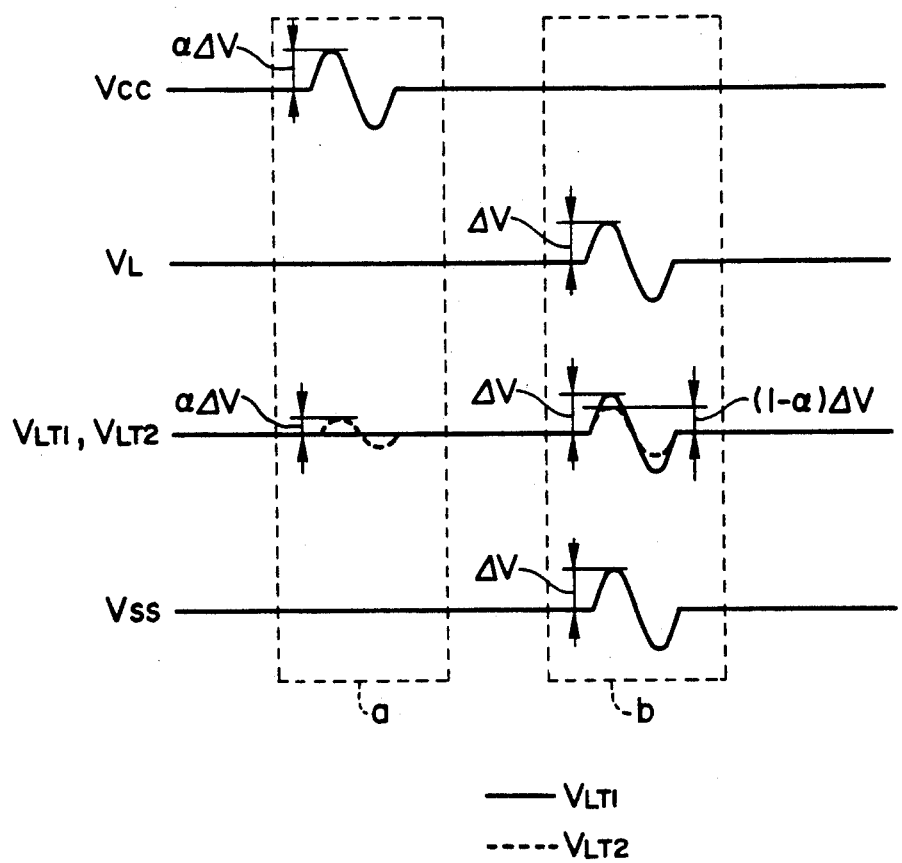
FIG. 22 is an operating waveform diagram of the semiconductor device shown in FIG. 21.
Figure 23:
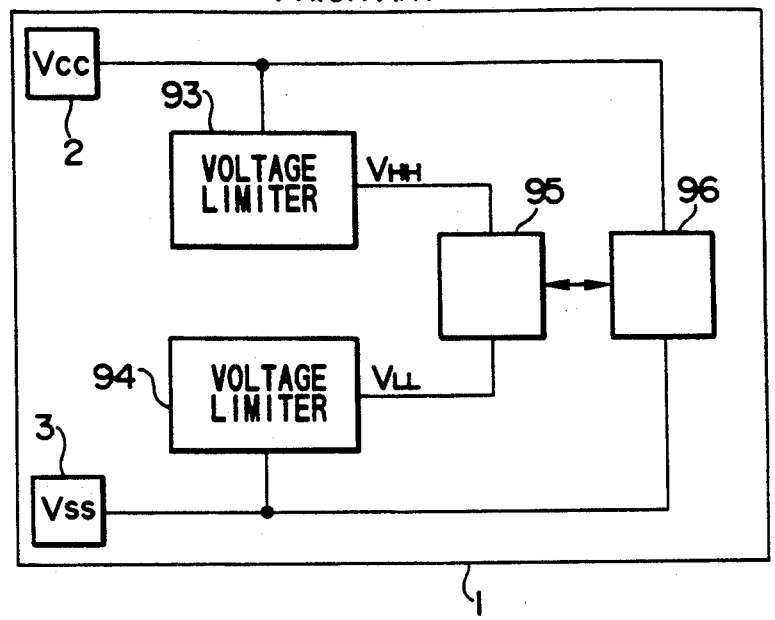
FIG. 23 is a block diagram of a conventional semiconductor device.
Figure 24:
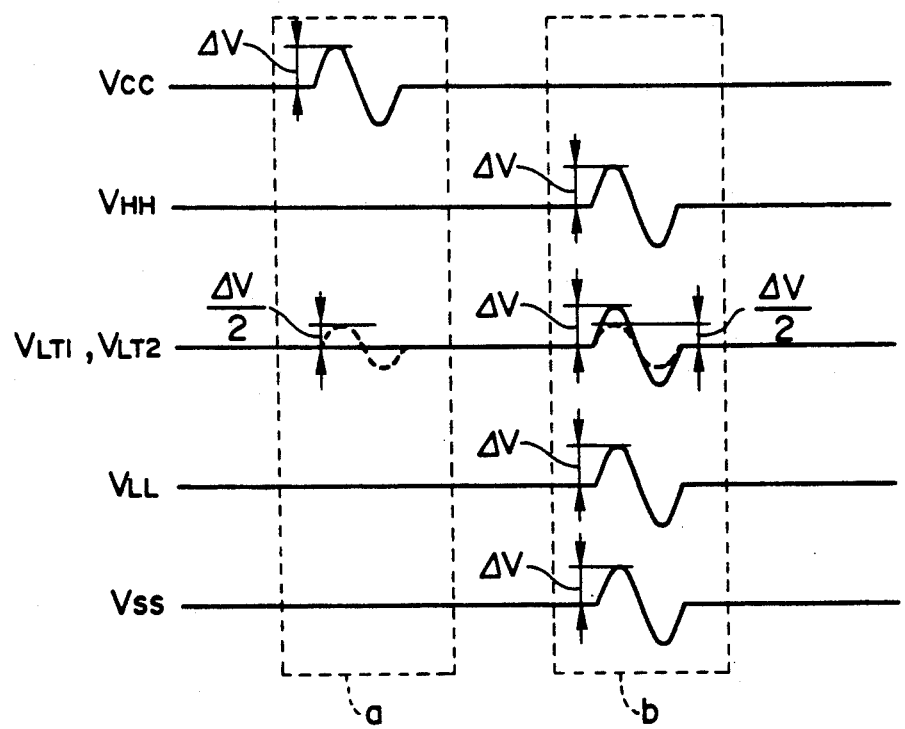
FIG. 24 is an operating waveform diagram of the semiconductor device shown in FIG. 23.
Figure 25:
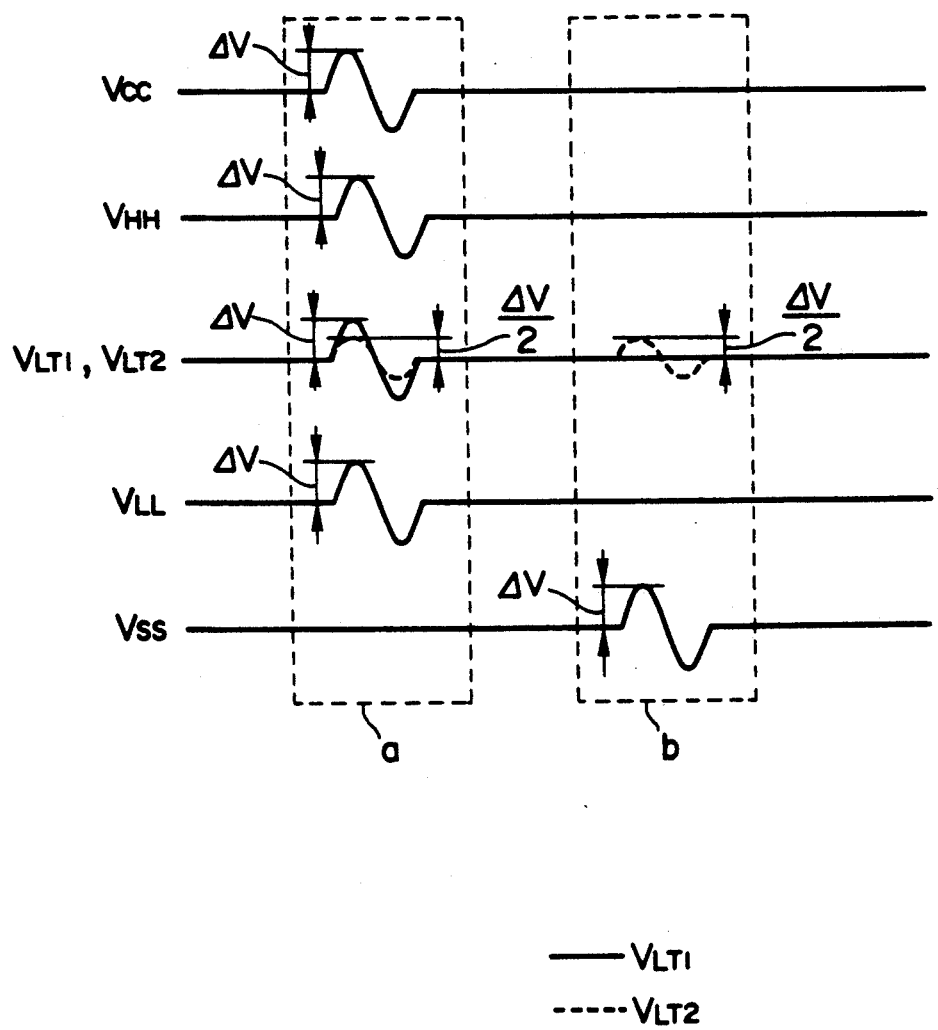
FIG. 25 is an operating waveform diagram of the semiconductor device shown in FIG. 23.

FIG. 20 shows the relationship between the threshold voltage Vth of a MOSFET and the delay time. It is assumed that absolute values of threshold voltages of the P-channel and the N-channel are equal to each other for the sake of simplicity. A ratio b of the voltage VCC−VLL=VHH−VSS applied to the gates of the MOSFETs at the output stage to the logical amplitude VHH−VLL is adopted as a parameter. A case when b=1, i.e., VCC=VHH and VSS=VLL, corresponds to a conventional inverter. As it is apparent from the figure, the delay time becomes shorter as b gets bigger. Moreover, the effects are larger as the threshold voltages of the MOSFETs are higher as compared with the logical amplitude. For example, if Vth=0.3 V when the external power supply voltage VCC−VSS=3.2 V and VHH−VLL=0.8 V, the delay time becomes 44% that of a conventional case, and become 35% that of a conventional case when Vth=0.5 V. Thus, this circuit is effective for making the logical amplitude smaller than that of the external power supply voltage thereby to reduce power consumption. This is because the threshold voltage of the MOSFET cannot be lowered since a leakage current caused by tailing is suppressed.

Incidentally, this circuit is not necessarily required to use it by combining with a voltage limiter circuit. Even when the power supply voltages VHH and VLL are applied externally, the effects of delay time reduction described above are obtainable, and moreover, power consumption of the voltage limiter circuit can be economized.

Figure 26:
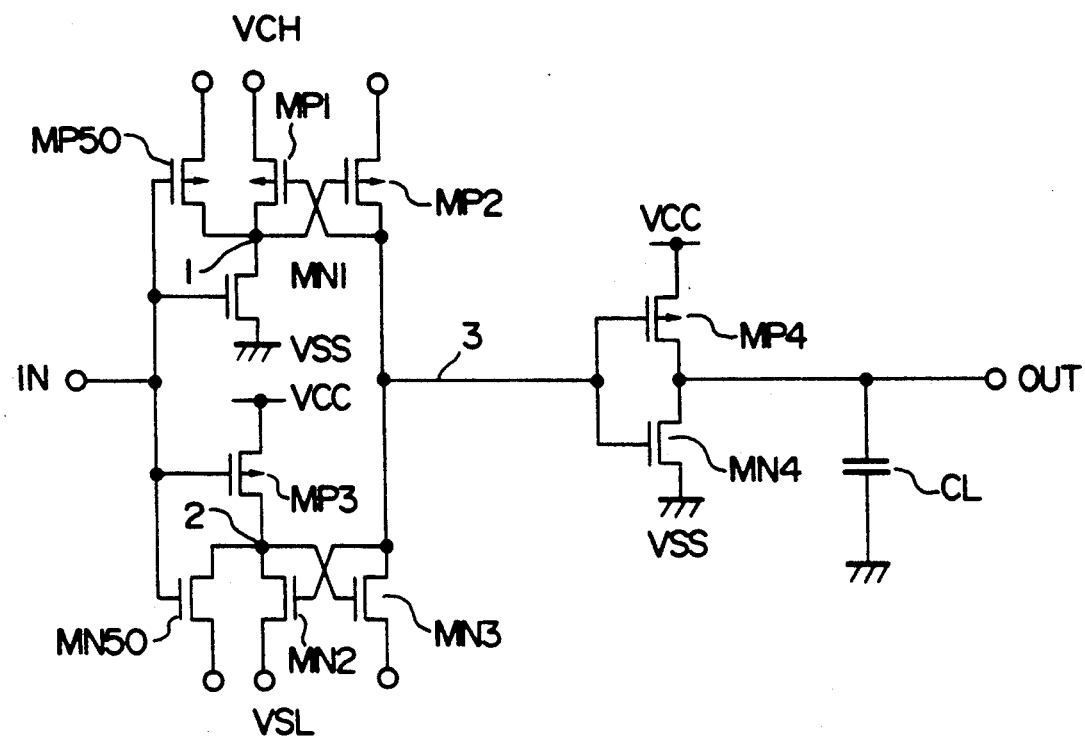
FIG. 26 is a diagram showing an embodiment of the present invention.

FIG. 26 shows another embodiment of the present invention. The present circuit is composed of n-channel MOS transistors (nMOS) MN1 to MN4 and MN50, and p-channel MOS transistors (pMOS) MP1 to MP4 and MP50, and is a driver circuit for driving a load capacity CL. The operation of this circuit will be described with reference to schematic operating waveforms shown in FIG. 27.

First, when the input IN is at the low voltage VSS, MN1 is OFF and MP3 and MP50 are ON. Therefore, a node 3 snows a low voltage VSL by MN3. The gate voltage of MP2 is OFF because it is charged to VCH by MP1 which is cross-connected. Thus, the output OUT becomes a high voltage VCC.

When the input IN varies from the low voltage VSS to the high voltage VCC, MP50 is turned OFF, MN1 is turned ON and MP2 is turned ON, thus the node 3 varies from the low voltage VSL to the high voltage VCH. On the other hand, since the gate voltage node 2 of MN3 is discharged to VSL by cross-connected MN2, it is turned OFF. As a result, the node 3 is charged to the high voltage VCH, and the output OUT varies to show the low voltage VSS. In case the input IN varies from VCC to VSS, MP3 varies from OFF to ON reversely to the above, the node 3 is discharged to the low voltage VSL and the output OUT is charged to the high voltage VCC.

Figure 27:
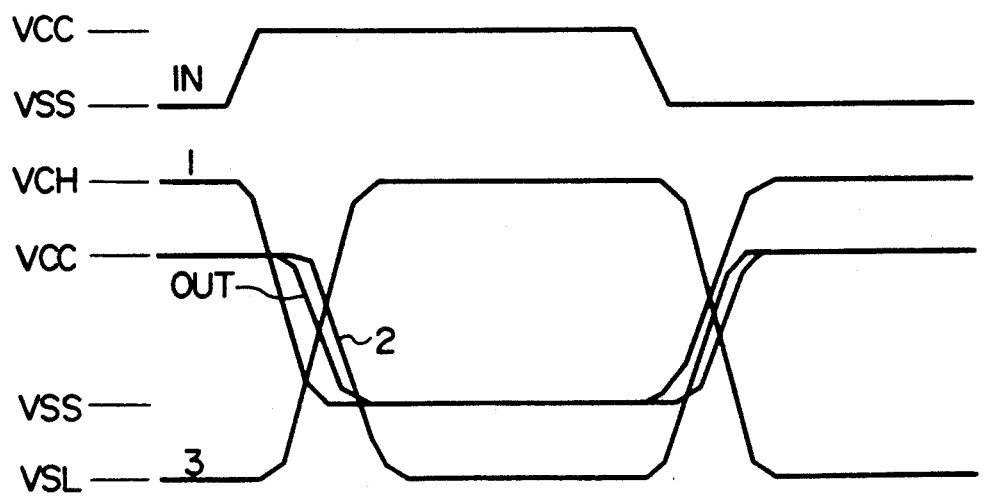
FIG. 27 is a diagram for explaining FIG. 26.

The feature of the present circuit is that the power supplies VSS and VCC of the inverter circuit composed of MP4 and MN4 for driving the load capacity CL and the power supplies VSL and VCH of the circuit for driving the inverter circuit are separated, and the voltage values are set so that VSL is lower than VSS and VCH is higher than VCC as shown in FIG. 27. For example, when it is assumed that the power supplies VSS and VCC for driving the load are supplied from the outside of the chip, it is sufficient that VCH and VSL are generated inside the chip. When VCH and VSL are supplied externally, VCC and VSS are generated internally. Otherwise, it may also be arranged so that VCH and VSS are supplied externally, and VCC and VSL are generated internally.

Since the gate voltage of the MOS transistor for driving the load capacity CL can be made higher according to the present embodiment, it is possible to eliminate the influence by the threshold voltage Vth of MP4 and MN4 so as to aim at high speed. Further, it is possible to perform stable operation without lowering Vth even when the operating voltage becomes a voltage as low as 1.5 V or lower.

Figure 28:
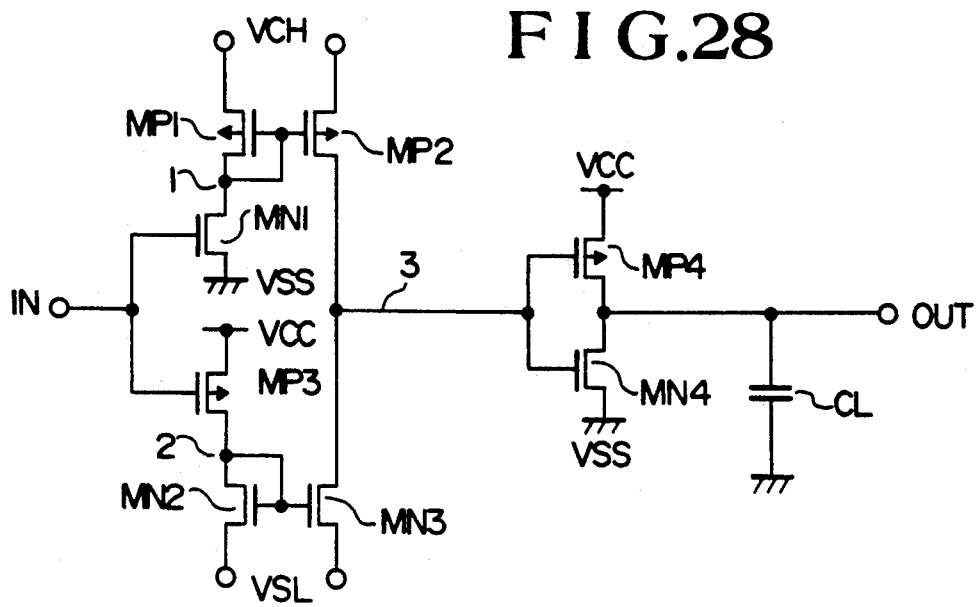
FIG. 28 shows another embodiment of the present invention.

FIG. 28 illustrates an embodiment in which cross-connection of MP1, MP2 and MN2, MN3 shown in FIG. 26 is changed to current mirror connection. As it is well-known, a current mirror circuit is able to apply a current obtained by multiplying the current flowing in MP1 by WMP2 (channel width of MP2)/WMP1 (channel width of MP1), thereby to obtain a large driving capacity.

The same effects as those obtainable in FIG. 26 are expected in the present embodiment, too. Furthermore, in the current mirror connection, MP2 is turned OFF in case the input IN is a low voltage and MN1 is OFF. The gate voltage node 1 of MP2 is charged to a voltage lower by Vth of MP1 and MP2 from VCH, however, there is also such a merit that the time for charging the node 3 is accelerated for the portion of Vth when MN1 is turned ON. The same is applied when the node 3 is discharged.

Figure 29:
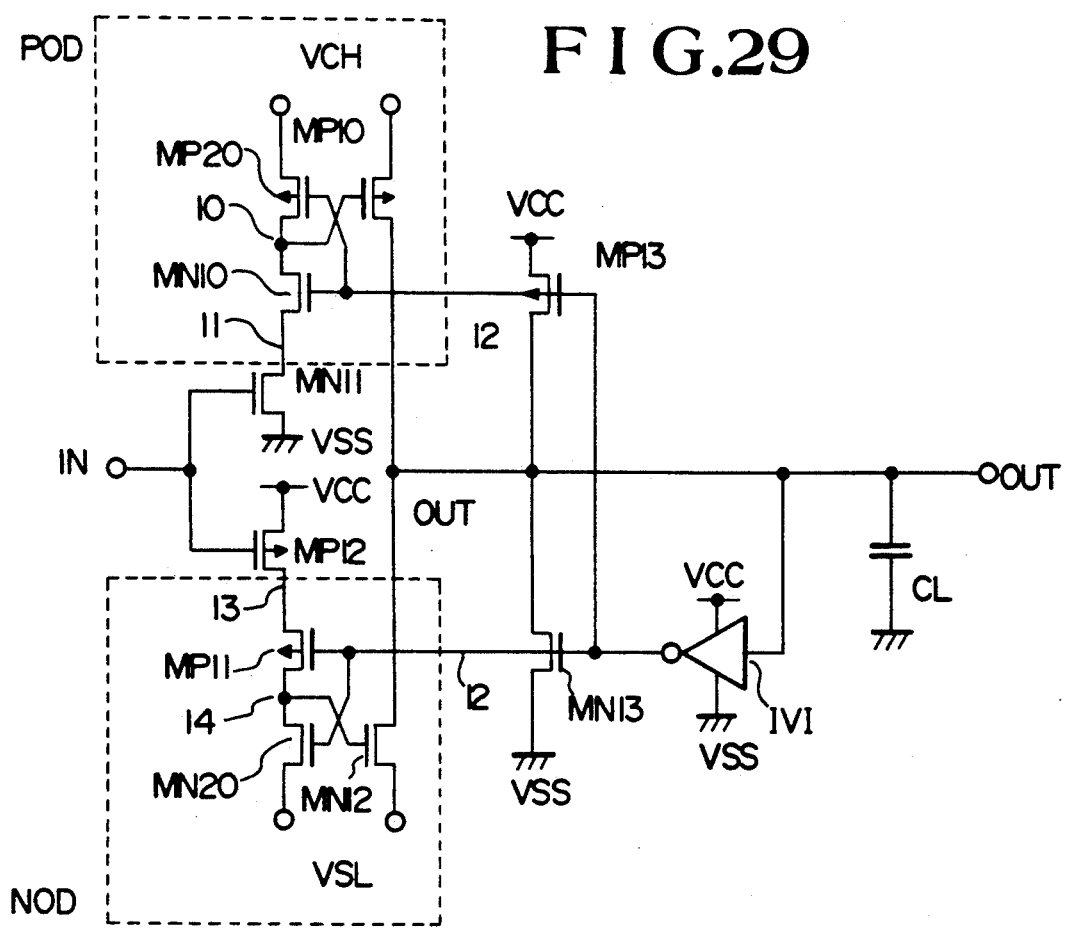
FIG. 29 shows still another embodiment of the present invention.
Figure 30:
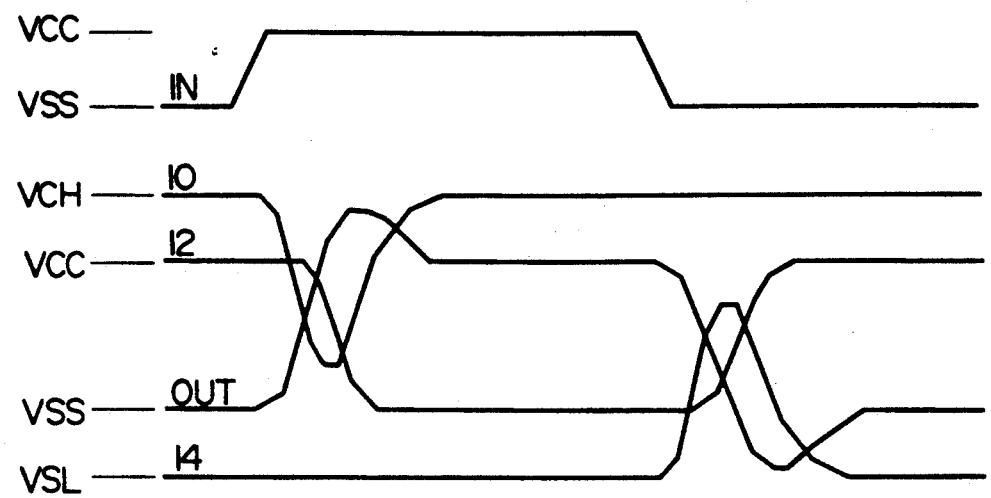
FIG. 30 is a diagram for explaining the operation of FIG. 29.

FIG. 29 shows another embodiment of the present invention. The present circuit is composed of a control circuit POD on the high voltage side including MP10, MP20 and MN10 for charging to a voltage VCH higher than the ordinary power supply voltage VCC, a control circuit MOD on the low voltage side including MP11, MN20 and MN12 for discharging to a voltage VSL lower than the ordinary operating voltage range, and an inverter IV1 for detecting the voltage of the output OUT. Further, MN10 and MP11 of above-mentioned POD and NOD represent MOS transistors for suspending the circuit operation depending on the result of detection by IV1. The operation of the present circuit will be described with reference to schematic operating waveforms shown in FIG. 30. In case the input IN is a low voltage, MN11 is OFF, MP12 is ON, MP13 is OFF, MN13 is ON, and the output OUT is at the low voltage VSs. The node 12 is at a high voltage and transistors other than MN10 and MN20 in POD and NOD are OFF by means of the inverter IV1. The output OUT maintains the low voltage VSS by MN13. When the input IN varies from a low voltage to a high voltage, MN11 is turned ON, a node 10 is discharged to a low voltage since MN10 is ON and the output OUT is charged rapidly to VCH by means of MP10. When the voltage of OUT exceeds the logical threshold of the inverter IV1, the node 12 presents a low voltage, thus turning MN10 of POD OFF, MP20 ON, and MP10 OFF. At this time, OUT is charged almost to VCH by means of circuit delay in IV1 and MN10. On the other hand, MP11 of NOD is turned ON, but MN12 is kept OFF intact since MP12 is OFF. Now, the output OUT charged once to VCH becomes VCC by means of MP13, thus enabling it to output a pulse including overshoot in a rise waveform as shown in FIG. 30. When the input IN varies from the high voltage to the low voltage, it is possible to output a pulse including overshoot in the fall waveform similarly to the rise waveform with only such an exception that operations of above-mentioned pMOS and nMOS are reversed.

According to the present embodiment, the output OUT is charged rapidly toward VCH. Therefore, the time required to reach the logical threshold at the next stage (intermediate voltage between VSS and VCC) becomes shorter than the time required for charging toward VCC, thus making it possible to achieve high-speed operation. Furthermore, since the time required to become either higher or lower than the ordinary operating voltage range is in an instant even in case the element is scaled down and the element breakdown voltage is lowered, a high speed operation can be achieved while securing the reliability intact. Further, when a load driving MOS composed of MP4 and MN4 shown in FIG. 26 is added, effects similar to those obtained in FIG. 26 are achievable. In this case, the output OUT is applied to the gates of MP4 and MN4. Therefore, as against that the gate voltage when the output is changed over varies from VSL lower than the ordinary operating voltage VSS or from VCH higher than the ordinary operating voltage VCC in FIG. 26, the gate voltage varies from VSS and VCC in the present embodiment. Hence, the high speed operation can be accomplished by that portion.

Figure 31:
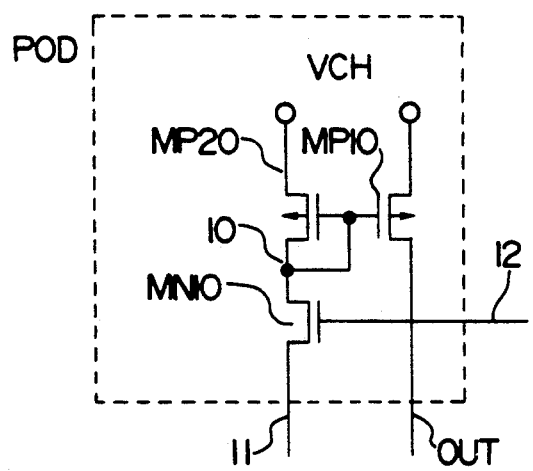
FIG. 31 shows another embodiment of POD for controlling an overshoot waveform of the output.

FIG. 31 shows another embodiment of a control circuit POD on the high voltage side. In the present embodiment, cross-connection of MP10 and MP20 shown in FIG. 29 is changed to current mirror connection.

Similar effects as those obtained in FIG. 29 are also obtainable in the present embodiment. Furthermore, current mirror connection also has an advantage that the operating time is faster than cross-connection because the gate voltage of MP10 is charged to a voltage lower than VCH by Vth as described previously.

Figure 32:
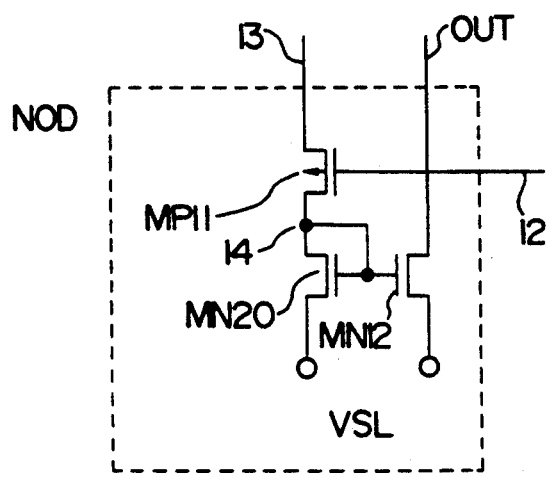
FIG. 32 shows still another embodiment of NOD for controlling an overshoot waveform of the output.

FIG. 32 shows another embodiment of a control circuit NOD on the low voltage side. In the present embodiment, cross-connection of MN20 and MN12 shown in FIG. 29 is changed to current mirror connection.

Similar effects to those obtained in FIG. 29 are also obtainable in the present embodiment. Furthermore, as described previously, current mirror connection also has such an advantage that the operating time is faster than that of cross-connection since the gate voltage of MN12 is charged to a voltage higher than VSL by Vth.

Inside an LSI, there are a pulse required to be high in speed on the rise side only and a pulse required to be high in speed on the fall side only depending on the type of the load and the circuit configuration.

Figure 33:
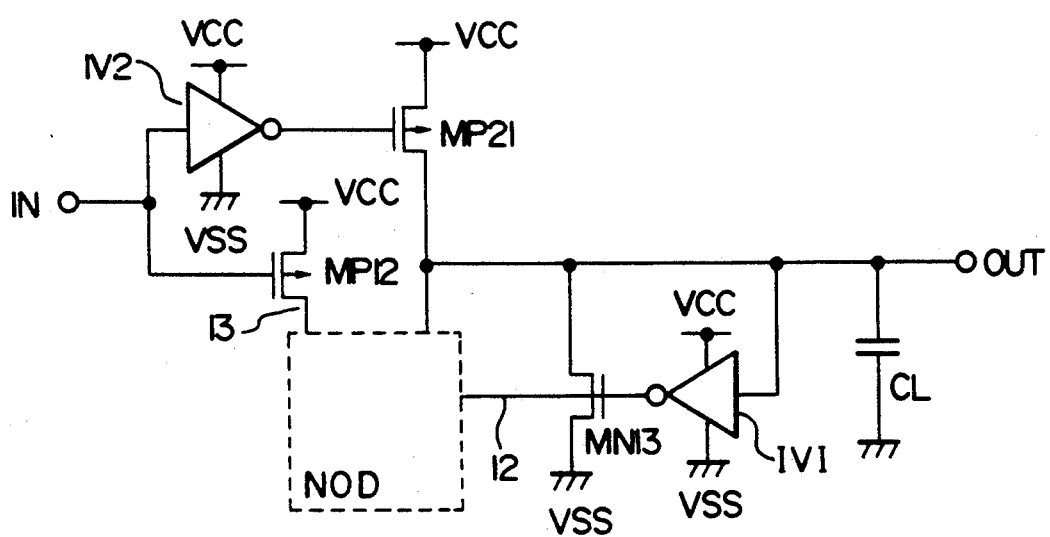
FIG. 33 shows an embodiment in which the present invention is applied only to the falling side of a pulse.

FIG. 33 shows an embodiment in which the present invention is applied only to the fall side of a pulse. In the present embodiment, the control circuit POD on the high voltage side, MN11 and MP13 shown in FIG. 29 are replaced with an inverter IV2 and MP21, and a pulse including overshoot is outputted to OUT only when the input IN varies from the high voltage to the low voltage and the output OUT varies from the high voltage to the low voltage. In case the input IN varies from the low voltage to the high voltage, the output OUT is charged to the ordinary operating voltage VCC by means of the inverter IV2 and MP21. The operation of the control circuit NOD on the low voltage side, IV1, MN13 and MP12 is similar to that in FIG. 29.

According to the present embodiment, it is possible to aim at high speed of a pulse in which high speed performance is required only on the fall side thereof. Further, the layout area can be made smaller, too.

Figure 34:
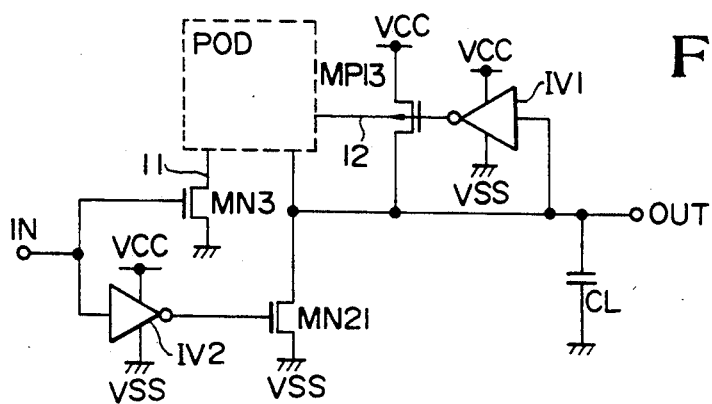
FIG. 34 shows an embodiment in which the present invention is applied only to the rising side of a pulse.

FIG. 34 shows an embodiment in which the present invention is applied only to the rise side of a pulse. In the present embodiment, the control circuit NOD on the low voltage side, MP12 and MN13 shown in FIG. 29 are replaced with the inverter IV2 and MN21, and a pulse including overshoot is outputted to OUT only when the input IN varies from the high voltage to the low voltage and the output OUT varies from the low voltage to the high voltage. In case the input IN varies from the high voltage to the low voltage, the output OUT is discharged to the ordinary operating voltage VSS by means of the inverter IV2 and MN21. The operation of the control circuit POD on the high voltage side, IV1, MPB and MN11 is similar to that in FIG. 29.

According to the present embodiment, it is possible to aim at high speed of a pulse in which high speed performance is required only on the rise side thereof. Further, the layout area can be made smaller, too.

Figure 35:
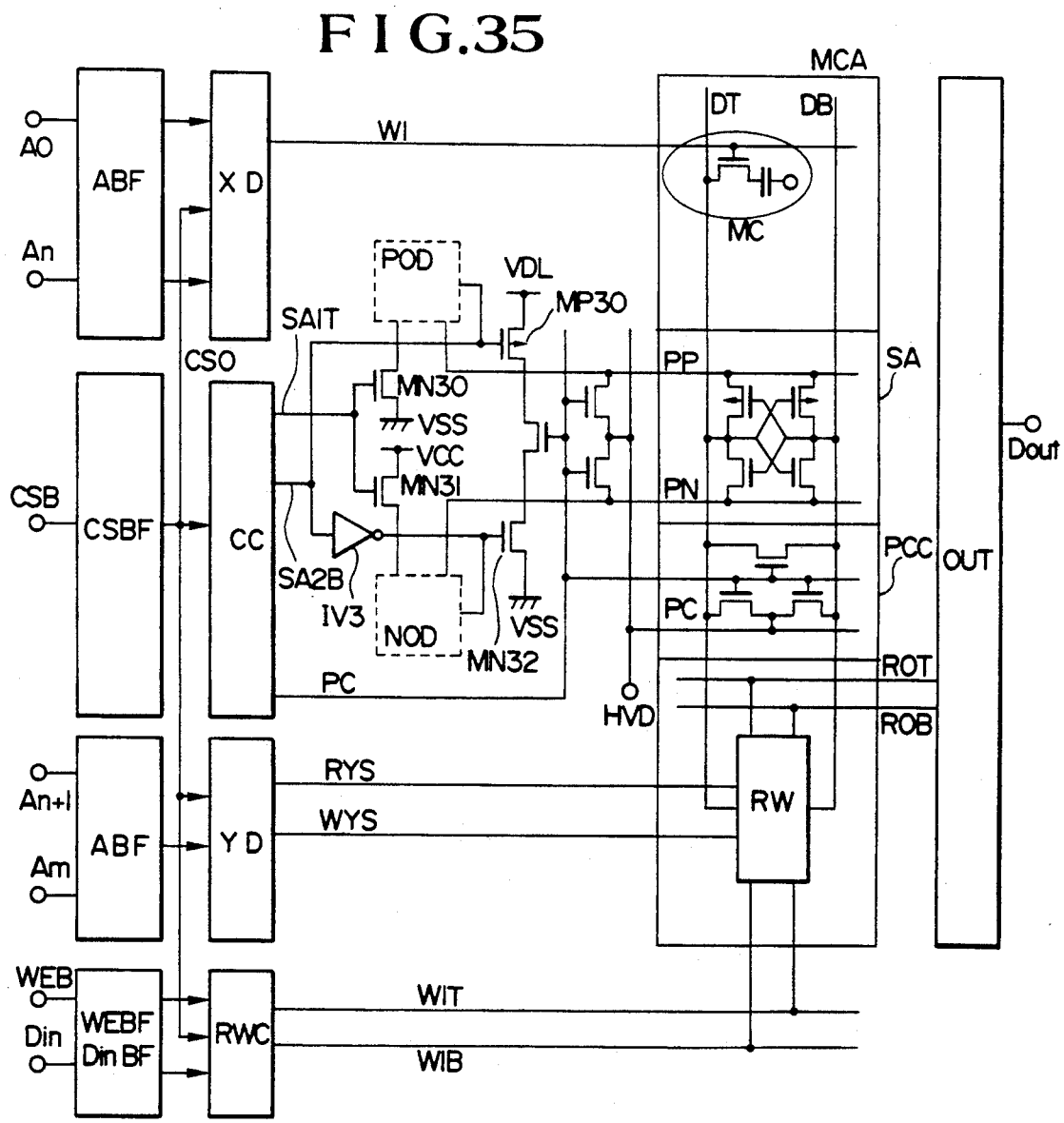
FIG. 35 shows an embodiment in which the present invention is applied to a sense amplifier drive circuit of a DRAM.
Figure 36:
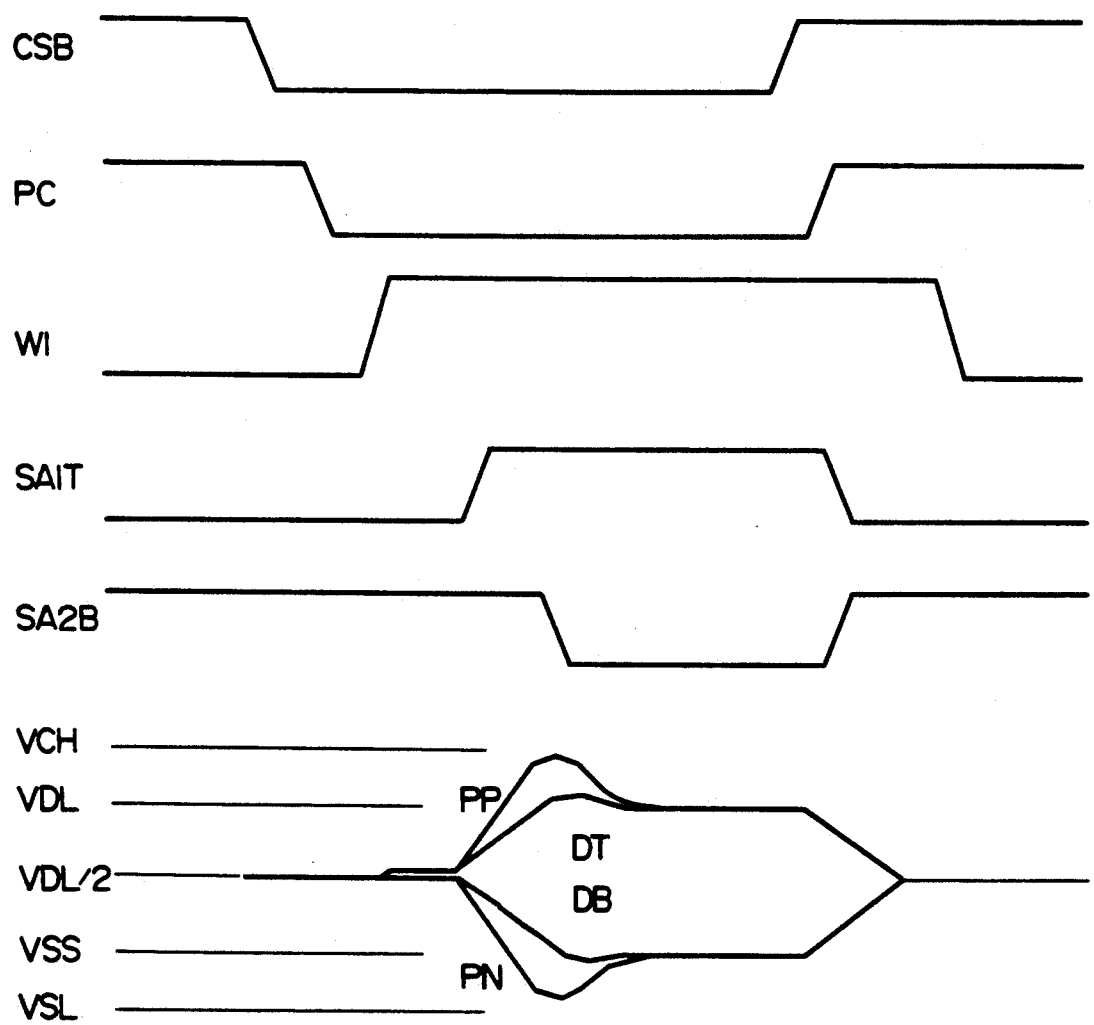
FIG. 36 is a diagram for explaining the operation of FIG. 35.

FIG. 35 is a circuit block diagram when the present invention is applied to a sense amplifier drive circuit of a dynamic RAM (DRAM). A0 to Am represent address inputs, CSB represents a chip activating signal, WEB represents a write/read control signal, and Din represents write information. ABF, CSBF, WEBF and DinBF represent input buffers of respective input signals. Further, XD represents an X decoder and word driver, CC represents a control circuit, YD represents a Y decoder and YS driver, RWC represents a write control circuit, a circuit composed of POD, NOD, MN30, MN31, MP30, MP32 and IV3 is a sence amplifier drive circuit, MCA represents a memory cell array, SAC represents a sense amplifier section composed of a sense amplifier SA, a data line precharge circuit PCC and a write/read circuit RW, and OUT represents an output circuit. The operation of the present circuit will be described with reference to schematic operating waveforms shown in FIG. 36. When the chip activating signal CSB shows a low voltage and the chip is activated, a word line and an RYS line (read cycle) or a WYS line (write cycle) are selected corresponding to an external input address. Now, it is assumed that the word line W1 and the RYS line are selected in the read cycle. When the word line is selected and rises, stored information in a memory cell is read out onto a data line DT. This read out small signal is detected with the read/write circuit RW and outputted outside as Dout through the output circuit OUT. Simultaneously with this, the small signal read out onto the data line is amplified by the sense amplifier SA. With this amplification, SA1T rises to a high voltage first so as to turn MN30 and MN31 ON, the control circuit POD on the high voltage side and the control circuit NOD on the low voltage side operate as explained with respect to FIG. 29 thereby to charge a sense amplifier driving line PP to VCH which is higher than the ordinary operating voltage VDL and to discharge PN to VSL which is lower than the ordinary operating voltage VSS. With this, the operation of the sense amplifier is made high in speed. Thereafter, a control signal SA2B is brought to a low voltage thereby to sustain the operation of POD and NOD so as to return to the ordinary data line voltages VDL and VSS by means of MP30 and MN32.

According to the present embodiment, it is possible to realize high-speed charge and discharge of the data line since the operating voltage of the sense amplifier of the DRAM becomes high effectively. Further, high speed operation is made possible even when the data line is at a low voltage.

In general, amplification of a data line by means of the sense amplifier SA is fast in discharge by PN and slow in charge by PP. This is because of the difference in the driving capacity between pMOS and nMOS and a fact that the driving capacity of the nMOS is made large in order to improve read-write characteristics. Thus, the amplification speed of a data line is regulated by discharge operation in many cases. In such a case, it is effective that the present invention is applied only to the sense amplifier driving line PP of a dynamic RAM (DRAM). What is different from FIG. 35 is the method of generating of the sense amplifier driving line PN only, and the operation of the other circuits is similar to that in FIG. 35. In the present embodiment, a conventional driving method in which only the sense amplifier driving line PP is charged to VCH at the ordinary operating voltage VDL or higher and PN is discharged to the ordinary operating voltage VSS is adopted.

According to the present embodiment, it is possible to make the discharge time of the data line of the DRAM high in speed. Further, in a DRAM, there are provided a plurality of sense amplifiers, and the load capacity is large since these sense amplifiers are driven in a sense amplifier driving circuit in one circuit. When two units of voltage sources capable of feeding a charge current and a discharge current from such a large load capacity are provided in a chip, power consumption is increased and the layout area becomes large. In such a case, techniques for making PP only high in speed in the present embodiment become effective.

Figure 38:
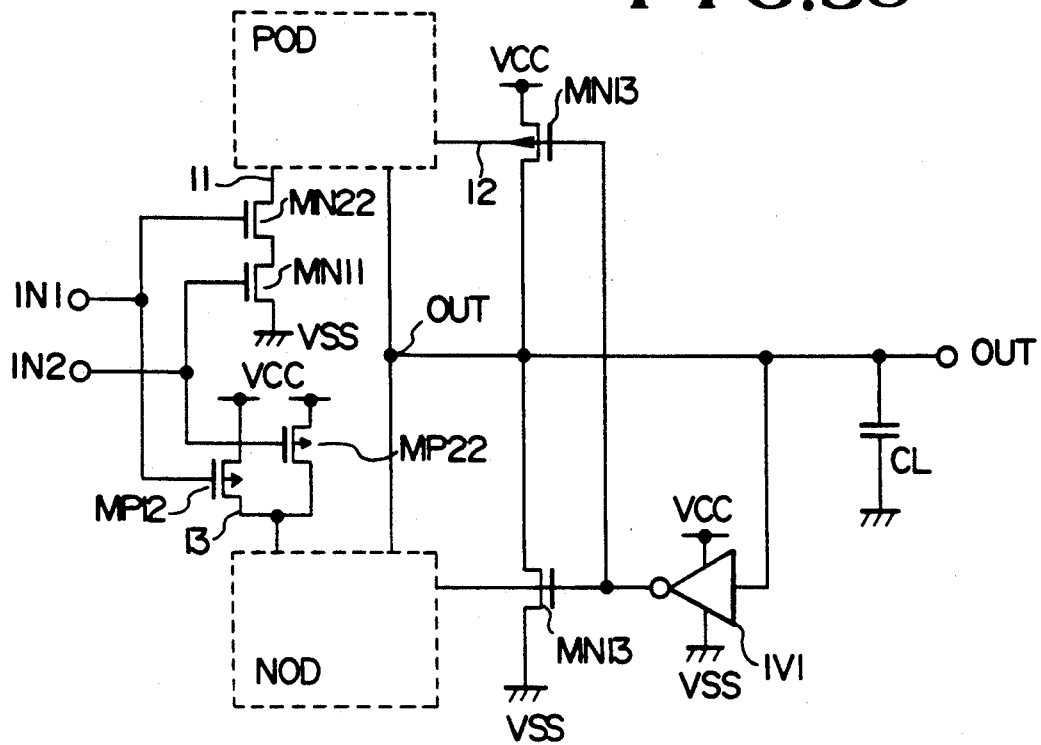
FIG. 38 shows an embodiment in which the present invention is applied to an AND circuit.

FIG. 38 shows an embodiment in which the present invention is applied to a logical circuit. In the present embodiment, MN22 is added in series with MN11 and MP22 is added in parallel with MP12 to the embodiment shown in FIG. 29 so as to fabricate an AND circuit. Only when both the inputs IN1 and IN2 are at a high voltage, MN22 and MN11 are turned ON and MP12 and MP22 are turned OFF. Thus, POD operates and the output OUT shows a high voltage. When either one of IN1 and IN2 or both of them are at a low voltage, NOD operates and OUT shows a low voltage. A truth table is shown in Table 1. The operation of the other circuits is similar to that in FIG. 29. Further, when an inverter composed of MP4 and MN4 shown in FIG. 26 is added to the output OUT, a NAND circuit is obtained, thus making it possible to make the gate voltage of the inverter higher temporarily so as to aim at high speed.

<TABLE 1>

| IN1 | IN2 | OUT |
| --- | --- | --- |
| low voltage | low voltage | low voltage |
| high voltage | low voltage | low voltage |
| low voltage | high voltage | low voltage |
| high voltage | high voltage | high voltage |

According to the present embodiment, it is possible to aim at high speed performance and stabilization of the operation at a low voltage of an AND circuit or a NAND circuit.

Figure 39:
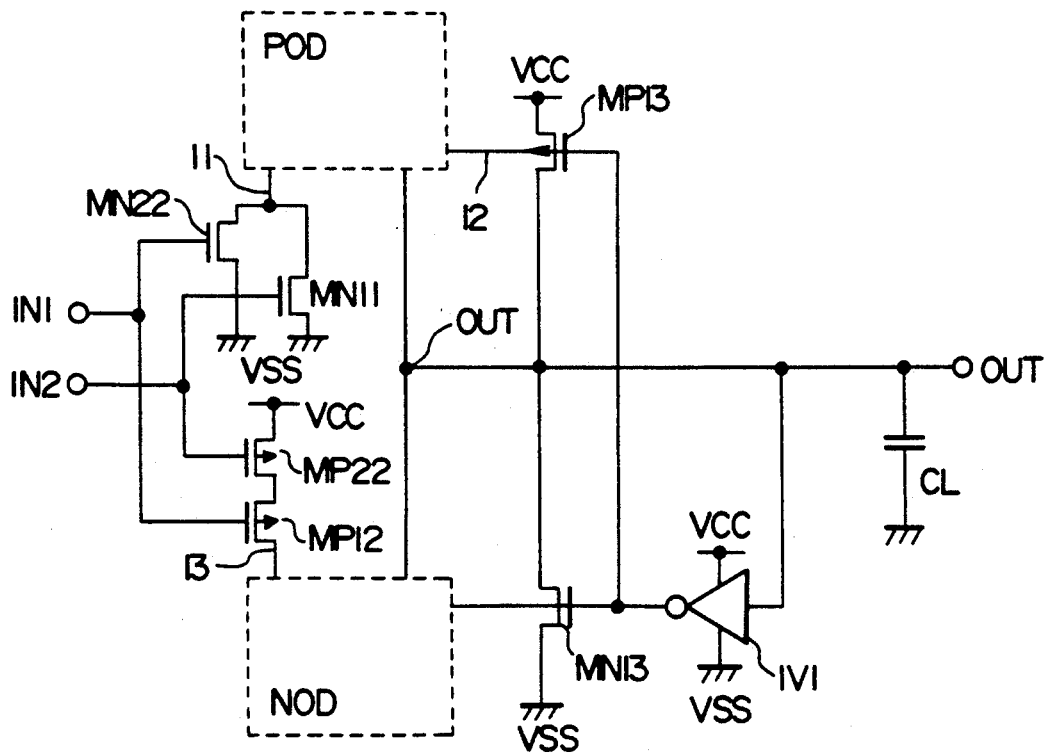
FIG. 39 shows an embodiment in which the present invention is applied to an OR circuit.

FIG. 39 shows another embodiment in which the present invention is applied to a logical circuit. In the present embodiment, MN22 is added in parallel with MN11 and MP22 is added in series with MP12 to the embodiment shown in FIG. 29 so as to fabricate an OR circuit. Only when both inputs IN1 and IN2 are at a low voltage, MP22 and MP12 are turned ON and MN22 and MNP11 are turned OFF. Thus, NOD operates and the output OUT shows a low voltage. When either one of IN1 and IN2 or both of them are at a high voltage, POD operates and OUT shows a high voltage. A truth table is shown in Table 2.

The operation of the other circuits is similar to that in FIG. 29. Further, when an inverter composed of MP4 and MN4 shown in FIG. 26 is added to the output OUT, an NOR circuit is obtained, thus making it possible to increase the gate voltage of the inverter temporarily so as to aim at high speed performance.

<TABLE 2>

| IN1 | IN2 | OUT |
| --- | --- | --- |
| low voltage | low voltage | high voltage |
| high voltage | low voltage | high voltage |
| low voltage | high voltage | high voltage |
| high voltage | high voltage | low voltage |

According to the present embodiment, it is possible to aim at high speed performance and stabilization of operation at a low voltage of an OR circuit or a NOR circuit.

Figure 41:
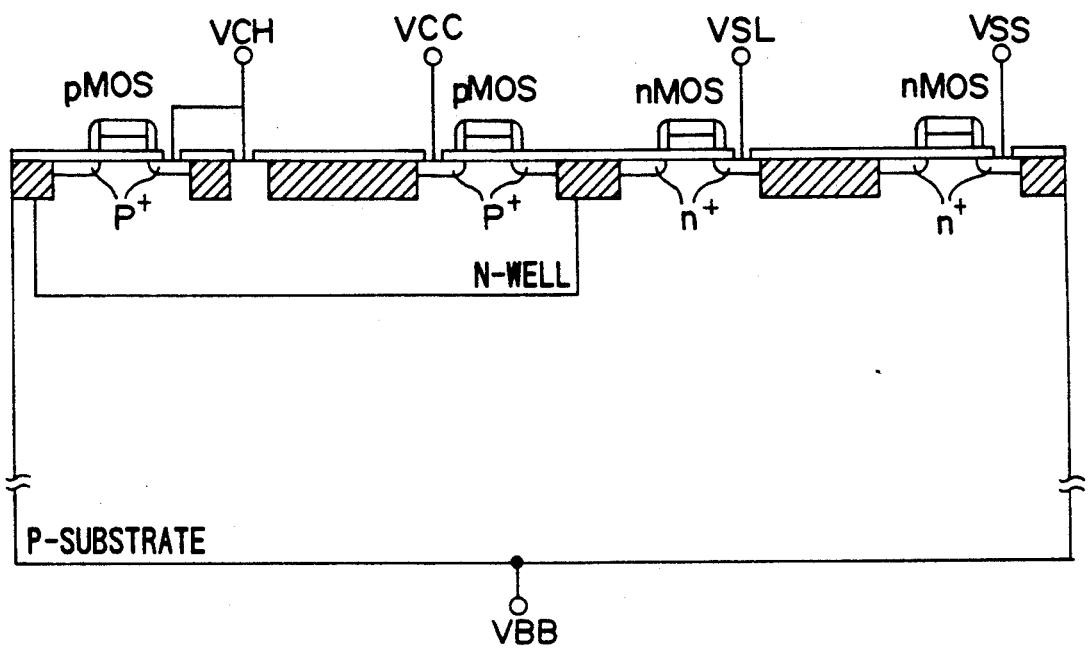
FIG. 41 shows a sectional structure of an LSI with the present invention mounted thereon.

Since four types of power supply voltages, VCC, VCH, VSS and VSL, are used in the present invention, it is important to select voltage values of substrate bias voltages of an nMOS and a pMOS. When the present invention is applied to a DRAM, a substrate bias voltage is applied in the DRAM for two purposes of (1) a countermeasure against extrinsic noises (input undershoot) and (2) reduction of junction capacitance. FIG. 41 illustrates a method of applying a substrate bias voltage with a sectional structure of an LSI. It is sufficient that a substrate bias voltage VBB of an nMOS is applied at a voltage lower than VSL, and the highest voltage VCH is applied to a substrate of a pMOS.

According to the present invention, the present invention can be realized with a basic CMOS process.

Figure 42:
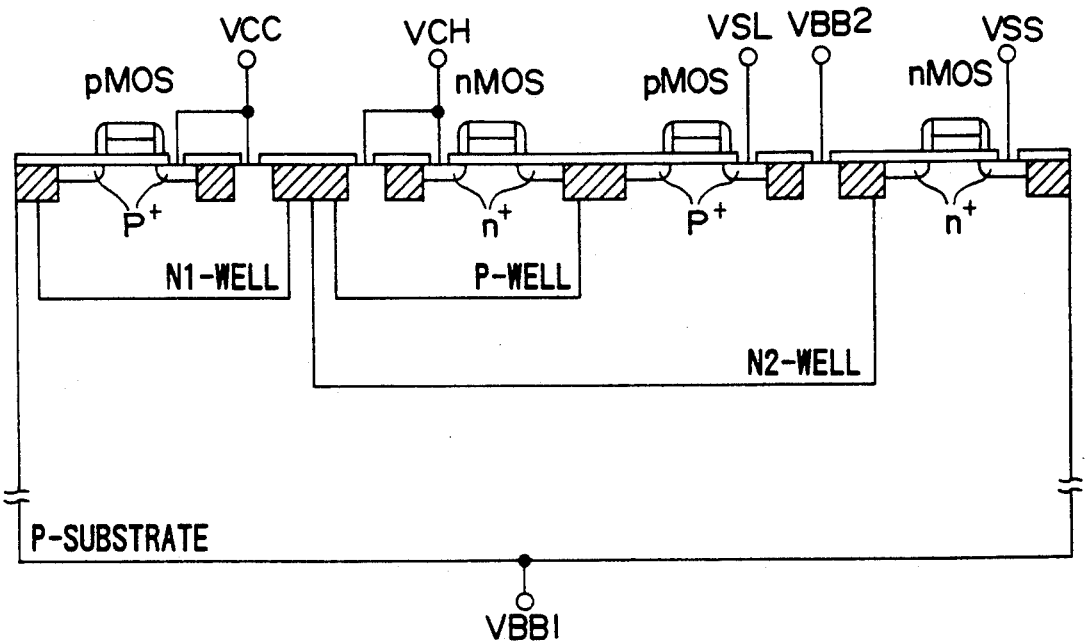
FIG. 42 shows a sectional structure of an LSI with the present invention mounted thereon.

In the embodiment shown in FIG. 41, however, since the substrate of the nMOS connected to VSL at the source thereof and the substrate of the nMOS connected to VSS at the source thereof are the same, the threshold voltage Vth of both nMOS's varies depending on the substrate bias effect. The same is applied to the pMOS. In such a case, it is sufficient to separate the substrate of respective MOS transistors by using a triple structure shown in FIG. 42 and apply an appropriate substrate bias voltage. Namely, the substrate of the pMOS connected to VCC at the source thereof is connected to VCC, and the substrate of the nMOS connected to VCH at the source thereof is connected to VCH. Similarly, it is sufficient to connect the substrate of the nMOS connected to VSS at the source thereof to VBB1, and to connect the substrate of the pMOS connected to VSL at the source thereof to VBB2. Further, in the operation of a low voltage which is another object of the present invention, the following harmful influence is magnified when the substrate bias voltage is applied.

(1) The threshold voltage of an element disperses (the setting accuracy of the threshold voltage is deteriorated) due to dispersion of the substrate bias voltage.

(2) By applying the substrate bias voltage, threshold voltage drop in a short channel region (short channel effect) becomes more intense, which is disadvantageous for forming a short channel.

Because of such reasons, it is preferable that the substrate bias voltage is at 0 V in the operation at a low voltage. It is possible to realize the substrate bias voltage at 0 V easily by employing the triple structure shown in FIG. 42 in this case, too. Namely, the substrate of the pMOS is connected to VCC and VCH, respectively, corresponding to the source voltage as described previously. As to the substrate of the nMOS, it is sufficient that VBB1 is connected to VSS and VBB2 is connected to VSL.

According to the present embodiment, it is possible to apply the substrate bias voltage of the MOS transistor properly in respective MOS transistors.

Here, all of the four voltages, VCR, VCC, VSs and VSL, may be applied from the outside, or VCC and VSS may be applied from the outside so as to generate VCH and VSL inside the chip. Otherwise, VCH and VSL may be applied from the outside so as to generate VCC and VSS inside. The externally applied voltage and the internally generated voltage can be combined freely with each other, and the essence of the present invention will never be changed whichever manner they are combined. An example of concrete voltage values is shown in Table 3.

<TABLE 3>

|  | Example 1 | Example 2 | Example 3 | Example 4 | Example 5 |
|---|---|---|---|---|---|
| VCH | 4.3 V | 3.3 V | 4.3 V | 3.3 V | 2.5 V |
| VCC | 3.3 V | 2.3 V | 3.3 V | 2.3 V | 1.5 V |
| VSS | 0 | 1 V | 1.0 V | 0 | 0 |
| VSL | −1 V | 0 | 0 | −1 V | −1 V :External application |

Figure 37:
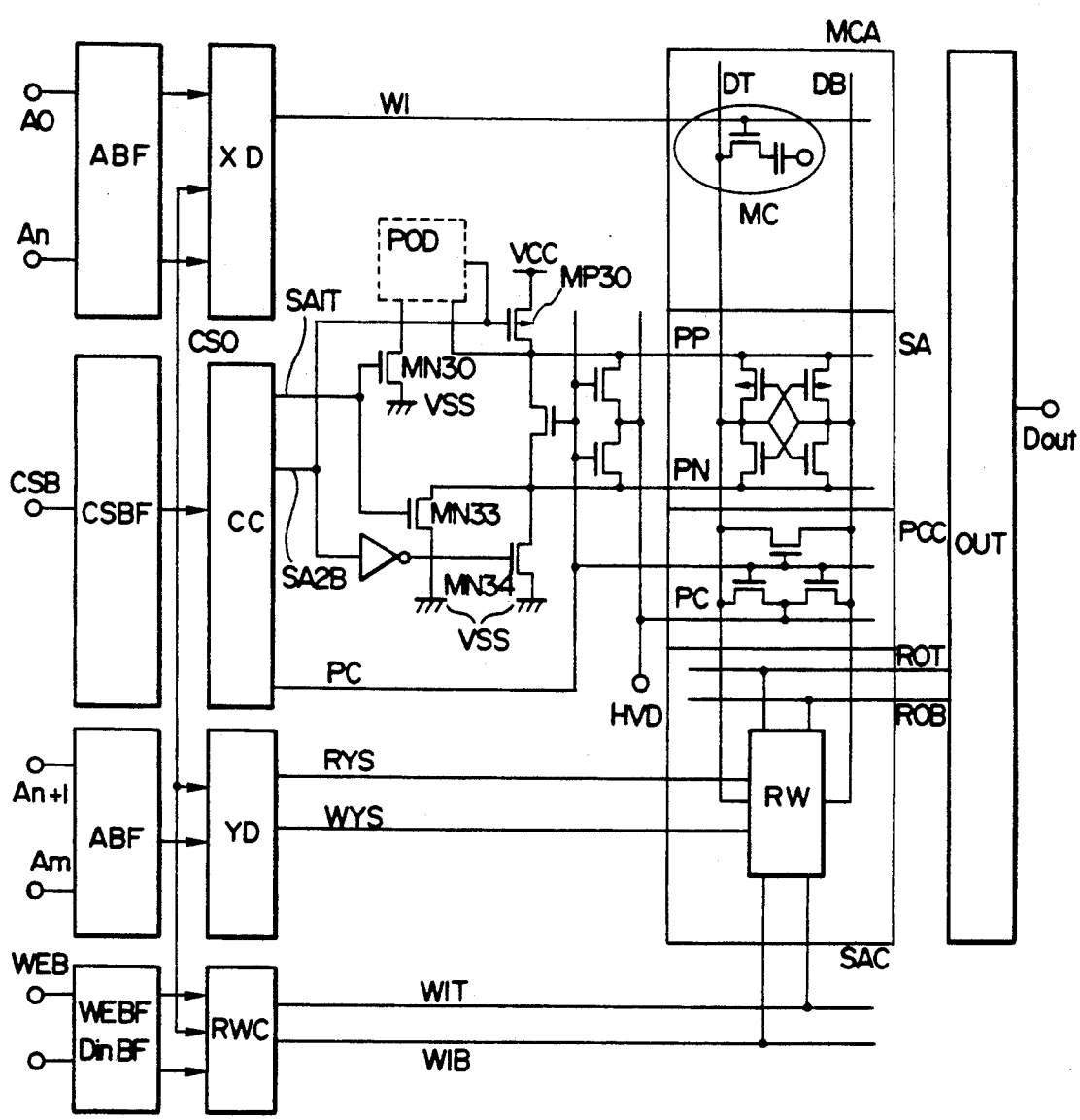
FIG. 37 shows another embodiment in which the present invention is applied to a sense amplifier drive circuit of a DRAM.
Figure 43:
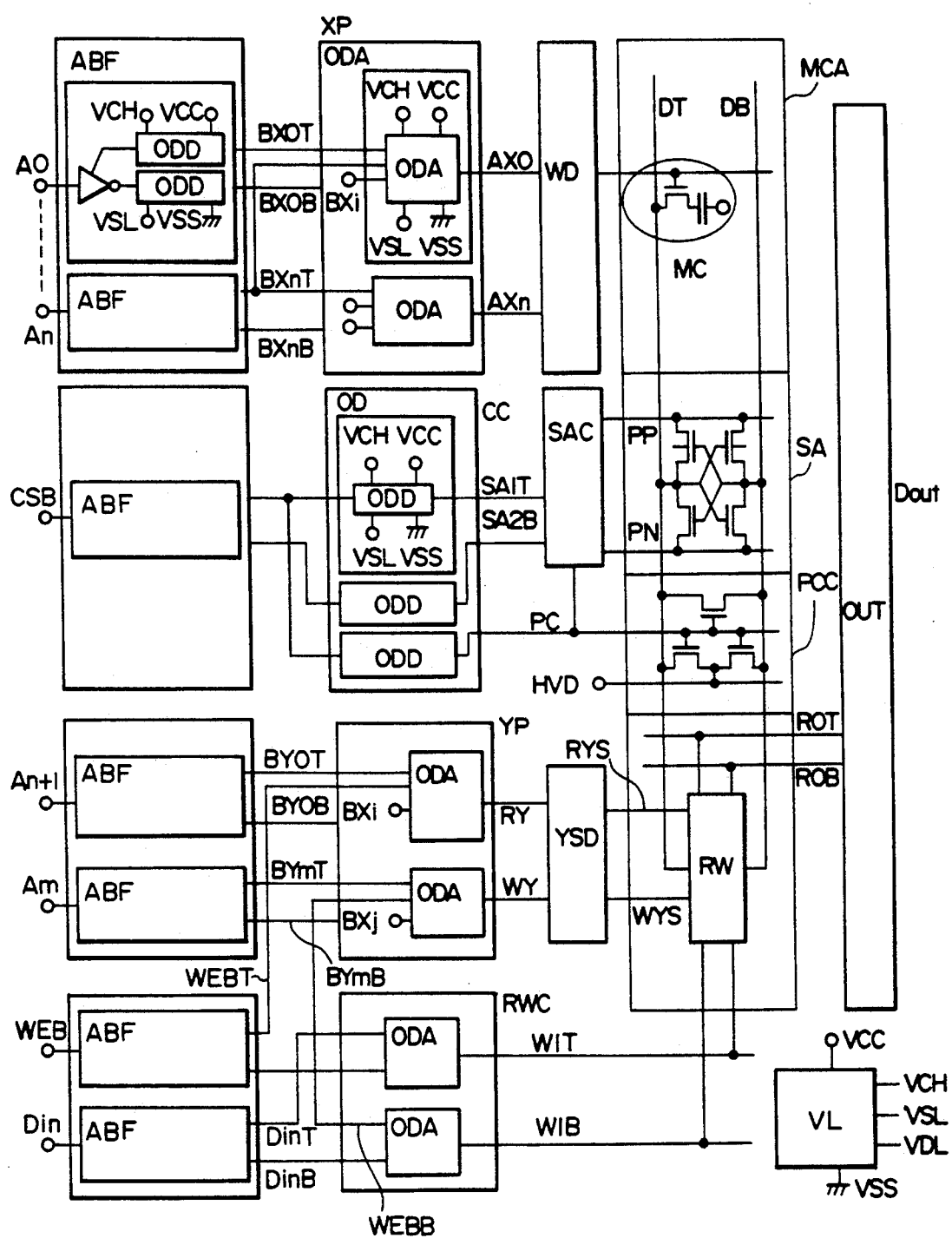
FIG. 43 shows an embodiment in which the present invention is applied to a DRAM.

FIG. 43 shows an example in which the present invention is applied to a DRAM. ABF represents an address buffer. Respective input buffers of a chip activating signal CSB, a write-read control signal WEB and data input Din employ the same circuit system as that of ABF. XP and WP represent an X predecoder for word line selection and a word driver, and correspond to XD shown in FIG. 35 and FIG. 37. CC represents a control circuit and SAC represents a driving circuit of sense amplifier driving lines PP and PN, which are the same as those shown in FIG. 35 and FIG. 37. YP and YSD represent a Y predecoder for selecting a read control signal RYS and a write control signal WYS and a driver, and correspond to YD shown in FIG. 35 and FIG. 37. VL represents a voltage limiter circuit such as disclosed in JP-A-58-70482, and generates a voltage to be applied to the driver of the present invention. The other circuits are the same as those shown in FIG. 35 and FIG. 37. ODD in ABF represents a driver shown in FIG. 26 to FIG. 34 of the embodiments of the present invention, and ODA represents an AND circuit shown in FIG. 38. The operation of the circuit is the same as that shown with respect to FIG. 35 and FIG. 37.

As described above, according to the present invention, disagreement of logical threshold is not produced among circuits even if the external power supply voltage fluctuates, thus increasing reliability of the circuits. Further, operation at high speed becomes possible even at a low logical amplitude.

According to the present invention, high speed can be aimed at because it is possible to drive a load with a pulse signal at a voltage higher than a stationary voltage or lower than the same transiently. Fruthermore, it is possible to increase the driving capacity of a MOS transistor and aim at high speed and stable operation at a low voltage by applying this pulse signal to the gate of the MOS transistor for driving a load.

What is claimed is:

1. A semiconductor integrated circuit device comprising:
   a first terminal to which a first external power supply voltage is applied;
   a second terminal to which with a second external power supply voltage is applied;
   first means for generating an intermediate voltage obtained by dividing said first and second external power supply voltages at a predetermined ratio;
   second means for generating a first internal power supply voltage between said first external power supply voltage and said intermediate voltage; and
   third means for generating a second internal power supply voltage between said second external power supply voltage and said intermediate voltage;
   wherein, both said first and second internal power supply voltages are stabilized with said intermediate voltage as a reference.

2. A semiconductor integrated circuit device accordding to claim 1, wherein a logical threshold of a first circuit operating with said first and second external power supply voltages as power supplies and a logical threshold of a second circuit operating with said first and second internal power supply voltages as power supplies are set so as to be substantially equal to said intermediate voltage.

3. A semiconductor integrated circuit device according to claim 1, wherein said intermediate voltage is almost equal to a mean value of said first and second external power supply voltages.

4. A semiconductor integrated circuit device according to claim 2, wherein said intermediate voltage is almost equal to a mean value of said first and second external power supply voltages.

* * * * *